United States Patent
Yu et al.

(10) Patent No.: US 8,218,666 B2
(45) Date of Patent: Jul. 10, 2012

(54) ADVANCED-VSB SYSTEM (A-VSB)

(75) Inventors: Jung-pil Yu, Suwon-si (KR); Hae-joo Jeong, Seoul (KR); Joon-soo Kim, Suwon-si (KR); Yong-sik Kwon, Seoul (KR); Eui-jun Park, Suwon-si (KR); Jin-hee Jeong, Suwon-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 297 days.

(21) Appl. No.: 12/615,414

(22) Filed: Nov. 10, 2009

(65) Prior Publication Data

US 2010/0054361 A1 Mar. 4, 2010

Related U.S. Application Data

(63) Continuation of application No. 11/416,254, filed on May 3, 2006, now Pat. No. 7,639,751.

(60) Provisional application No. 60/788,707, filed on Apr. 4, 2006.

(51) Int. Cl.
*H04L 5/12* (2006.01)
(52) U.S. Cl. ........................................ 375/265; 714/792
(58) Field of Classification Search .................. 375/140, 375/146, 147, 265, 295, 368; 370/491, 500
See application file for complete search history.

(56) References Cited

U.S. PATENT DOCUMENTS

| | | | |
|---|---|---|---|
| 5,233,349 A | 8/1993 | Moulsley | |
| 5,914,988 A | 6/1999 | Hu et al. | |
| 6,810,084 B1 | 10/2004 | Jun et al. | |
| 6,924,847 B2 * | 8/2005 | Choi et al. | 348/614 |
| 7,515,580 B2 * | 4/2009 | Wheatley et al. | 370/349 |
| 7,532,677 B2 | 5/2009 | Simon | |
| 7,752,528 B2 * | 7/2010 | Park et al. | 714/784 |
| 2002/0191712 A1 * | 12/2002 | Gaddam et al. | 375/301 |
| 2002/0194570 A1 | 12/2002 | Birru et al. | |
| 2003/0115540 A1 | 6/2003 | Bae et al. | |
| 2005/0041748 A1 | 2/2005 | Choi et al. | |
| 2005/0047496 A1 * | 3/2005 | McIntire et al. | 375/222 |

(Continued)

FOREIGN PATENT DOCUMENTS

KR 2004-90645 10/2004

(Continued)

OTHER PUBLICATIONS http://en.wikipedia.org/wiki/Multiplexer (Oct. 2007).*

(Continued)

*Primary Examiner* — Dac Ha
(74) *Attorney, Agent, or Firm* — Sughrue Mion, PLLC

(57) ABSTRACT

A method of resetting a trellis-coded modulation (TCM) encoder to a known state, the TCM encoder including a reset input that resets the TCM encoder to the known state when held at a reset level for a plurality of symbol clock cycles, the method including identifying an event to occur in the future that requires the TCM encoder to be reset to the known state; and holding the reset input of the TCM encoder at the reset level beginning the plurality of clock symbol cycles before a time the event will occur so that the TCM encoder will be reset to the known state immediately before the event occurs.

8 Claims, 29 Drawing Sheets

U.S. PATENT DOCUMENTS

| | | |
|---|---|---|
| 2005/0074069 A1 | 4/2005 | Choi et al. |
| 2006/0159193 A1 | 7/2006 | Mattsson et al. |
| 2007/0223612 A1 | 9/2007 | Simon |

FOREIGN PATENT DOCUMENTS

| | | |
|---|---|---|
| WO | WO 2006001635 A1 | 1/2006 |

OTHER PUBLICATIONS

Mexican Office Action, dated Jan. 12, 2011, issued in Application No. MX/a/2008/012890.
International Search Report issued on Jun. 22, 2007, in International Application No. PCT/KR2007/001654 (3 pages, in English).
Written Opinion of the International Searching Authority issued on Jun. 22, 2007, in International Application No. PCT/KR2007/001654 (4 pages, in English).
U.S. Appl. No. 11/416,254, filed May 3, 2006, Jung-pil Yu et al., Samsung Electronics Co., Ltd.
U.S. Appl. No. 11/416,258, filed May 3, 2006, Yong-sik Kwon et al., Samsung Electronics Co., Ltd.
U.S. Appl. No. 11/416,457, filed May 3, 2006, Jung-pil Yu et al., Samsung Electronics Co., Ltd.
U.S. Appl. No. 11/503,970, filed Aug. 15, 2006, Jung-pil Yu et al., Samsung Electronics Co., Ltd.
U.S. Appl. No. 11/504,024, filed Aug. 15, 2006, Jung-pil Yu et al., Samsung Electronics Co., Ltd.
U.S. Appl. No. 11/504,027, filed Aug. 15, 2006, Jung-pil Yu et al., Samsung Electronics Co., Ltd.
U.S. Appl. No. 11/504,029, filed Aug. 15, 2006, Jung-pil Yu et al., Samsung Electronics Co., Ltd.
U.S. Appl. No. 11/504,030, filed Aug. 15, 2006, Jung-pil Yu et al., Samsung Electronics Co., Ltd.
U.S. Appl. No. 11/504,031, filed Aug. 15, 2006, Jung-pil Yu et al., Samsung Electronics Co., Ltd.
U.S. Appl. No. 11/504,038, filed Aug. 15, 2006, Jung-pil Yu et al., Samsung Electronics Co., Ltd.
U.S. Appl. No. 11/504,651, filed Aug. 16, 2006, Jung-pil Yu et al., Samsung Electronics Co., Ltd.
U.S. Appl. No. 11/504,724, filed Aug. 16, 2006, Jung-pil Yu et al., Samsung Electronics Co., Ltd.
U.S. Appl. No. 11/504,725, filed Aug. 16, 2006, Jung-pil Yu et al., Samsung Electronics Co., Ltd.
U.S. Appl. No. 11/504,726, filed Aug. 16, 2006, Jung-pil Yu et al., Samsung Electronics Co., Ltd.
U.S. Appl. No. 11/505,369, filed Aug. 17, 2006, Jung-pil Yu et al., Samsung Electronics Co., Ltd.
U.S. Appl. No. 11/505,894, filed Aug. 18, 2006, Eui-jun Park et al, Samsung Electronics Co., Ltd.
U.S. Appl. No. 11/508,144, filed Aug. 23, 2006, Jung-pil Yu et al., Samsung Electronics Co., Ltd.
U.S. Appl. No. 11/523,716, filed Sep. 20, 2006, Jung-pil Yu et al., Samsung Electronics Co., Ltd.
U.S. Appl. No. 11/692,509, filed Mar. 28, 2007, Hae-joo Jeong et al., Samsung Electronics Co., Ltd.
U.S. Appl. No. 12/261,780, filed Oct. 30, 2008, Jung-pil Yu et al., Samsung Electronics Co., Ltd.
U.S. Appl. No. 12/263,017, filed Oct. 31, 2008, Yong-sik Kwon et al., Samsung Electronics Co., Ltd.
European Search Report issued in corresponding European Application No. 09177065.1 on Aug. 31, 2011.
Yong-Tae Lee et al: Apr. 2004, ETRI Journal Electron. & Telecommun. Res. Inst., Taejon South Korea, vol. 26, No. 2, pp. 92-100, XP002556814, ISSN: 1225-6463.

* cited by examiner

Normal VSB Frame         A- VSB Frame

FIG. 20

| | 3 bytes | 2 bytes | 6 bytes | {4, 14, 21} bytes | 182-{10,20,26} bytes |
|---|---|---|---|---|---|
| 1 | Header | AF Head | | {10, 20, 26} bytes of SRS | Normal 182-{10,20,26} bytes |
| 2 | Header | AF Head | | {10, 20, 26} bytes of SRS | Normal 182-{10,20,26} bytes |
| 3 | Header | AF Head | | {10, 20, 26} bytes of SRS | Normal 182-{10,20,26} bytes |
| 4 | Header | AF Head | | {10, 20, 26} bytes of SRS | Normal 182-{10,20,26} bytes |
| 5 | Header | AF Head | | {10, 20, 26} bytes of SRS | Normal 182-{10,20,26} bytes |
| 6 | Header | AF Head | | {10, 20, 26} bytes of SRS | Normal 182-{10,20,26} bytes |
| 7 | Header | AF Head | | {10, 20, 26} bytes of SRS | Normal 182-{10,20,26} bytes |
| 8 | Header | AF Head | | {10, 20, 26} bytes of SRS | Normal 182-{10,20,26} bytes |
| 9 | Header | AF Head | | {10, 20, 26} bytes of SRS | Normal 182-{10,20,26} bytes |
| 10 | Header | AF Head | | {10, 20, 26} bytes of SRS | Normal 182-{10,20,26} bytes |
| 11 | Header | AF Head | | {10, 20, 26} bytes of SRS | Normal 182-{10,20,26} bytes |
| 12 | Header | AF Head | | {10, 20, 26} bytes of SRS | Normal 182-{10,20,26} bytes |
| 13 | Header | AF Head | | {10, 20, 26} bytes of SRS | Normal 182-{10,20,26} bytes |
| 14 | Header | AF Head | | {10, 20, 26} bytes of SRS | Normal 182-{10,20,26} bytes |
| 15 | Header | AF Head | reserved for PCR | {4, 14, 20} bytes SRS | Normal 182-{10,20,26} bytes |
| 16 | Header | AF Head | | {10, 20, 26} bytes of SRS | Normal 182-{10,20,26} bytes |
| 17 | Header | AF Head | | {10, 20, 26} bytes of SRS | Normal 182-{10,20,26} bytes |
| 18 | Header | AF Head | | {10, 20, 26} bytes of SRS | Normal 182-{10,20,26} bytes |
| 19 | Header | AF Head | Splice | {9,19,25} bytes of SRS | Normal 182-{10,20,26} bytes |
| 20 | Header | AF Head | | {10, 20, 26} bytes of SRS | Normal 182-{10,20,26} bytes |
| 21 | Header | AF Head | | {10, 20, 26} bytes of SRS | Normal 182-{10,20,26} bytes |
| 22 | Header | AF Head | | {10, 20, 26} bytes of SRS | Normal 182-{10,20,26} bytes |
| 23 | Header | AF Head | | {10, 20, 26} bytes of SRS | Normal 182-{10,20,26} bytes |
| 24 | Header | AF Head | | {10, 20, 26} bytes of SRS | Normal 182-{10,20,26} bytes |
| 25 | Header | AF Head | | {10, 20, 26} bytes of SRS | Normal 182-{10,20,26} bytes |
| 26 | Header | AF Head | | {10, 20, 26} bytes of SRS | Normal 182-{10,20,26} bytes |
| 27 | Header | AF Head | | {10, 20, 26} bytes of SRS | Normal 182-{10,20,26} bytes |
| 28 | Header | AF Head | | {10, 20, 26} bytes of SRS | Normal 182-{10,20,26} bytes |
| 29 | Header | AF Head | | {10, 20, 26} bytes of SRS | Normal 182-{10,20,26} bytes |
| 30 | Header | AF Head | | {10, 20, 26} bytes of SRS | Normal 182-{10,20,26} bytes |
| 31 | Header | AF Head | | {10, 20, 26} bytes of SRS | Normal 182-{10,20,26} bytes |
| 32 | Header | AF Head | | {10, 20, 26} bytes of SRS | Normal 182-{10,20,26} bytes |
| 33 | Header | AF Head | | {10, 20, 26} bytes of SRS | Normal 182-{10,20,26} bytes |
| 34 | Header | AF Head | | {10, 20, 26} bytes of SRS | Normal 182-{10,20,26} bytes |
| 35 | Header | AF Head | | {10, 20, 26} bytes of SRS | Normal 182-{10,20,26} bytes |
| 36 | Header | AF Head | | {10, 20, 26} bytes of SRS | Normal 182-{10,20,26} bytes |
| 37 | Header | AF Head | | {10, 20, 26} bytes of SRS | Normal 182-{10,20,26} bytes |
| 38 | Header | AF Head | | {10, 20, 26} bytes of SRS | Normal 182-{10,20,26} bytes |
| 39 | Header | AF Head | | {10, 20, 26} bytes of SRS | Normal 182-{10,20,26} bytes |
| 40 | Header | AF Head | | {10, 20, 26} bytes of SRS | Normal 182-{10,20,26} bytes |
| 41 | Header | AF Head | | {10, 20, 26} bytes of SRS | Normal 182-{10,20,26} bytes |
| 42 | Header | AF Head | | {10, 20, 26} bytes of SRS | Normal 182-{10,20,26} bytes |
| 43 | Header | AF Head | | {10, 20, 26} bytes of SRS | Normal 182-{10,20,26} bytes |
| 44 | Header | AF Head | | {10, 20, 26} bytes of SRS | Normal 182-{10,20,26} bytes |
| 45 | Header | AF Head | | {10, 20, 26} bytes of SRS | Normal 182-{10,20,26} bytes |
| 46 | Header | AF Head | | {10, 20, 26} bytes of SRS | Normal 182-{10,20,26} bytes |
| 47 | Header | AF Head | | {10, 20, 26} bytes of SRS | Normal 182-{10,20,26} bytes |
| 48 | Header | AF Head | | {10, 20, 26} bytes of SRS | Normal 182-{10,20,26} bytes |
| 49 | Header | AF Head | | {10, 20, 26} bytes of SRS | Normal 182-{10,20,26} bytes |
| 50 | Header | AF Head | | {10, 20, 26} bytes of SRS | Normal 182-{10,20,26} bytes |
| 51 | Header | AF Head | | {10, 20, 26} bytes of SRS | Normal 182-{10,20,26} bytes |
| 52 | Header | AF Head | | {10, 20, 26} bytes of SRS | Normal 182-{10,20,26} bytes |

| | | \multicolumn{16}{c|}{Walsh Chip within Symbol} |
|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 |
| Modulation Symbol Index | 0 | 0 | 0 | 0 | 0 | 0 | 0 | 0 | 0 | 0 | 0 | 0 | 0 | 0 | 0 | 0 | 0 |
| | 1 | 0 | 1 | 0 | 1 | 0 | 1 | 0 | 1 | 0 | 1 | 0 | 1 | 0 | 1 | 0 | 1 |
| | 2 | 0 | 0 | 1 | 1 | 0 | 0 | 1 | 1 | 0 | 0 | 1 | 1 | 0 | 0 | 1 | 1 |
| | 3 | 0 | 1 | 1 | 0 | 0 | 1 | 1 | 0 | 0 | 1 | 1 | 0 | 0 | 1 | 1 | 0 |
| | 4 | 0 | 0 | 0 | 0 | 1 | 1 | 1 | 1 | 0 | 0 | 0 | 0 | 1 | 1 | 1 | 1 |
| | 5 | 0 | 1 | 0 | 1 | 1 | 0 | 1 | 0 | 0 | 1 | 0 | 1 | 1 | 0 | 1 | 0 |
| | 6 | 0 | 0 | 1 | 1 | 1 | 1 | 0 | 0 | 0 | 0 | 1 | 1 | 1 | 1 | 0 | 0 |
| | 7 | 0 | 1 | 1 | 0 | 1 | 0 | 0 | 1 | 0 | 1 | 1 | 0 | 1 | 0 | 0 | 1 |
| | 8 | 0 | 0 | 0 | 0 | 0 | 0 | 0 | 0 | 1 | 1 | 1 | 1 | 1 | 1 | 1 | 1 |
| | 9 | 0 | 1 | 0 | 1 | 0 | 1 | 0 | 1 | 1 | 0 | 1 | 0 | 1 | 0 | 1 | 0 |
| | 10 | 0 | 0 | 1 | 1 | 0 | 0 | 1 | 1 | 1 | 1 | 0 | 0 | 1 | 1 | 0 | 0 |
| | 11 | 0 | 1 | 1 | 0 | 0 | 1 | 1 | 0 | 1 | 0 | 0 | 1 | 1 | 0 | 0 | 1 |
| | 12 | 0 | 0 | 0 | 0 | 1 | 1 | 1 | 1 | 1 | 1 | 1 | 1 | 0 | 0 | 0 | 0 |
| | 13 | 0 | 1 | 0 | 1 | 1 | 0 | 1 | 0 | 1 | 0 | 1 | 0 | 0 | 1 | 0 | 1 |
| | 14 | 0 | 0 | 1 | 1 | 1 | 1 | 0 | 0 | 1 | 1 | 0 | 0 | 0 | 0 | 1 | 1 |
| | 15 | 0 | 1 | 1 | 0 | 1 | 0 | 0 | 1 | 1 | 0 | 0 | 1 | 0 | 1 | 1 | 0 |

ADVANCED-VSB SYSTEM (A-VSB)

CROSS-REFERENCE TO RELATED APPLICATIONS

This application is a continuation of application Ser. No. 11/416,254 filed on May 3, 2006, now U.S. Pat. No. 7,639,751 which claims the benefit of U.S. Provisional Application No. 60/788,707 filed on Apr. 4, 2006, now expired, the disclosures of which are incorporated herein by reference in their entirety.

BACKGROUND OF THE INVENTION

1. Field of the Invention

Aspects of the invention relate in part to enhancements to the Advanced Television Systems Committee (ATSC) Digital Television (DTV) System.

2. Description of the Related Art

The ATSC DTV system uses an 8-symbol vestigial sideband (8-VSB) transmission system which is susceptible to reception problems in certain applications and under certain conditions, such as in mobile applications and in communication over channels subject to Doppler fading.

An enhanced version of the 8-VSB system called the Enhanced-VSB (E-VSB) system has been developed. The E-VSB system enables an enhanced or robust data stream to be transmitted. This enhanced or robust data stream is intended to solve some of the reception problems that occur in the 8-VSB system. However, the E-VSB system is still susceptible to reception problems. The invention has been developed in part in an effort so solve the reception problems that occur in the 8-VSB and E-VSB systems, and includes an enhanced version of these systems known as the Advanced-VSB (A-VSB) system.

SUMMARY OF THE INVENTION

In accordance with an aspect of the invention, there is provided a method of resetting a trellis-coded modulation (TCM) encoder to a known state, the TCM encoder including a reset input that resets the TCM encoder to the known state when held at a reset level for a plurality of symbol clock cycles, the method including identifying an event to occur in the future that requires the TCM encoder to be reset to the known state; and holding the reset input of the TCM encoder at the reset level beginning the plurality of clock symbol cycles before a time the event will occur so that the TCM encoder will be reset to the known state immediately before the event occurs.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will be become apparent and more readily appreciated from the following description of embodiments of the invention, taken in conjunction with the accompanying drawings of which:

FIG. 20 shows one slice (52 segments) of a deterministic frame (DF) template for use with SRS;

FIG. 21 shows pattern byte values stored in an SRS pattern memory;

FIG. 23 show Walsh codes of (16) bits used in the A-VSB mode signaling scheme;

DETAILED DESCRIPTION OF THE EMBODIMENTS

Figure 1:
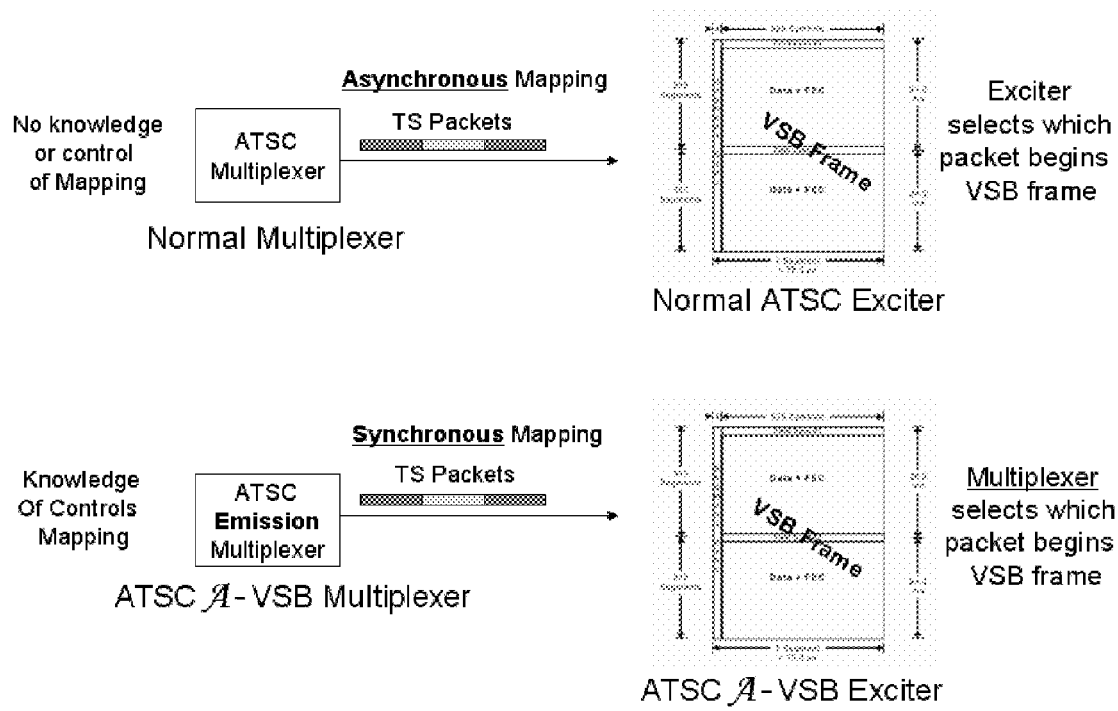
FIG. 1 shows asynchronous and synchronous mappings of ATSC transport stream (TS) packets to a VSB frame.

Reference will now be made in detail to embodiments of the invention, examples of which are shown in the accompanying drawings, wherein like reference numerals refer to like elements throughout. The embodiments are described below in order to explain the present invention by referring to the figures.

INTRODUCTION

Aspects of the invention described below include deterministic frame (DF), deterministic trellis reset (DTR), and supplementary reference sequence (SRS). These aspects of the invention are described in the context of the ATSC DTV 8-VSB system as part of an Advanced-VSB (A-VSB) system, but are not limited to use in such a context.

The following description presumes a familiarity with the Advanced Television Systems Committee (ATSC) Digital Television (DTV) System which incorporates aspects of the MPEG-2 system, details of which are described in the corresponding standards. Examples of such standards which may be relevant are ATSC A/52B, Digital Audio Compression Standard (AC-3, E-AC-3), Revision B, 14 Jun. 2005; ATSC A/53E, ATSC Digital Television Standard (A/53), Revision E, 27 Dec. 2005; Working Draft Amendment 2 to ATSC Digital Television Standard (A/53C) with Amendment 1 and Corrigendum 1; ATSC A/54A, Recommended Practice: Guide to the Use of the ATSC Digital Television Standard, 4 Dec. 2003; ATSC A110/A, Synchronization Standard for Distributed Transmission, Revision A, 19 Jul. 2005; ISO/IEC IS 13818-1:2000(E), Information technology—Generic coding of moving pictures and associated audio information: Systems (second edition) (MPEG-2); and ISO/IEC IS13818-2: 2000(E), Information technology—Generic coding of moving pictures and associated audio information: Video (second edition) (MPEG-2), the contents of which are incorporated herein by reference.

Deterministic frame and deterministic trellis reset prepare the 8-VSB system to be operated in a deterministic manner. In the A-VSB system, the emission multiplexer has knowledge of and signals the start of the 8-VSB frame to the A-VSB exciter. This a priori knowledge of the emission multiplexer allows intelligent multiplexing to be performed.

An absence of adequate equalizer training signals has encouraged receiver designs with an over-dependence on blind equalization techniques. SRS offers a system solution with adequate equalizer training signals coupled with the latest algorithmic advances in receiver design principles to achieve new levels of performance in dynamic environments. SRS improves normal stream reception.

An initial application of the A-VSB system might be to address reception issues of main stream services in fixed or portable modes of operation in ATSC DTV applications. The A-VSB system is backward compatible and will offer terrestrial broadcasters options to leverage technological change and meet changing consumer expectations going forward.

Deterministic Frame (DF)

The first element of A-VSB is to make the mapping of ATSC transport stream packets a synchronous process. Currently this is an asynchronous process. The current ATSC multiplexer at a Studio produces a fixed-rate transport stream with no knowledge of the 8-VSB physical layer frame structure or mapping of packets. This situation is shown in the top half of FIG. 1.

The normal (A/53) ATSC exciter randomly picks a packet it to map into the first segment of a VSB frame. No knowledge of this decision and hence the temporal position of any transport stream packet in the VSB frame is known to the upstream multiplexer. In the ATSC A-VSB system disclosed herein, the emission multiplexer makes a deliberate decision of which packet the ATSC exciter should map into the first segment of the VSB frame. This decision is then signaled to the A-VSB exciter which operates as a slave to the emission multiplexer. The starting packet coupled with knowledge of the fixed VSB frame structure, gives the emission multiplexer knowledge of every packet's position in the VSB frame. This situation is shown in the bottom half of FIG. 1. This fundamental change in the selection of the starting packet is called "deterministic frame" (DF). Briefly stated, the A-VSB emission multiplexer will work in harmony with the A-VSB exciter to perform intelligent multiplexing. The DF allows special pre-processing in the emission multiplexer and synchronous post-processing in the exciter.

The deterministic frame is required to enable the use of an emission multiplexer and an A-VSB exciter. The emission multiplexer is a special-purpose ATSC multiplexer that is used at the studio or network operations center (NOC) and directly feeds one or more 8-VSB transmitters all having an A-VSB exciter. Hence the term "emission" multiplexer is used.

The first compatible change in the ATSC system design is the required locking of both the emission multiplexer transport stream clock and the symbol clock of the A-VSB exciter to a universally available frequency reference. The 10 MHz reference from a GPS receiver is used for this purpose. Locking both the symbol and transport stream clocks to an external reference provides the needed stability and buffer management in a simple, straightforward manner. One additional benefit to legacy and new ATSC receivers will be a stable ATSC symbol clock, without the jitter that can occur with the current system design. The preferred transport stream interface supported on the emission multiplexer and the A-VSB exciter will be asynchronous serial interface (ASI).

The emission multiplexer is considered to be a master and its syntax and semantics will signal to the A-VSB operating as a slave which transport stream packet shall be used as the first VSB data segment in a VSB Frame. Since the system is operating with synchronous clocks, it can be stated with 100% certainty which 624 transport stream (TS) packets make up a VSB frame with the A-VSB exciter slaved to the syntax and semantics of the emission multiplexer. A simple frame counter that counts 624 TS packets numbered 0 through 623 is provided in the emission multiplexer. When SFN is used as described below, DF is achieved through the insertion of a VSB frame initialization packet (VFIP) in the last (623rd) TS packet in a VSB frame as described in detail below. However, if SFN is not used, then another simple syntax can be used, such as the data frame cadence signal (CS) in ATSC A/110 referred to above (it inverts the MPEG sync byte every 624 packets) as one example. The ATSC VSB frame can be viewed by the emission multiplexer as being divided into 12 groups or slices each having (52) data segments.

Deterministic Trellis Reset

Figure 2:
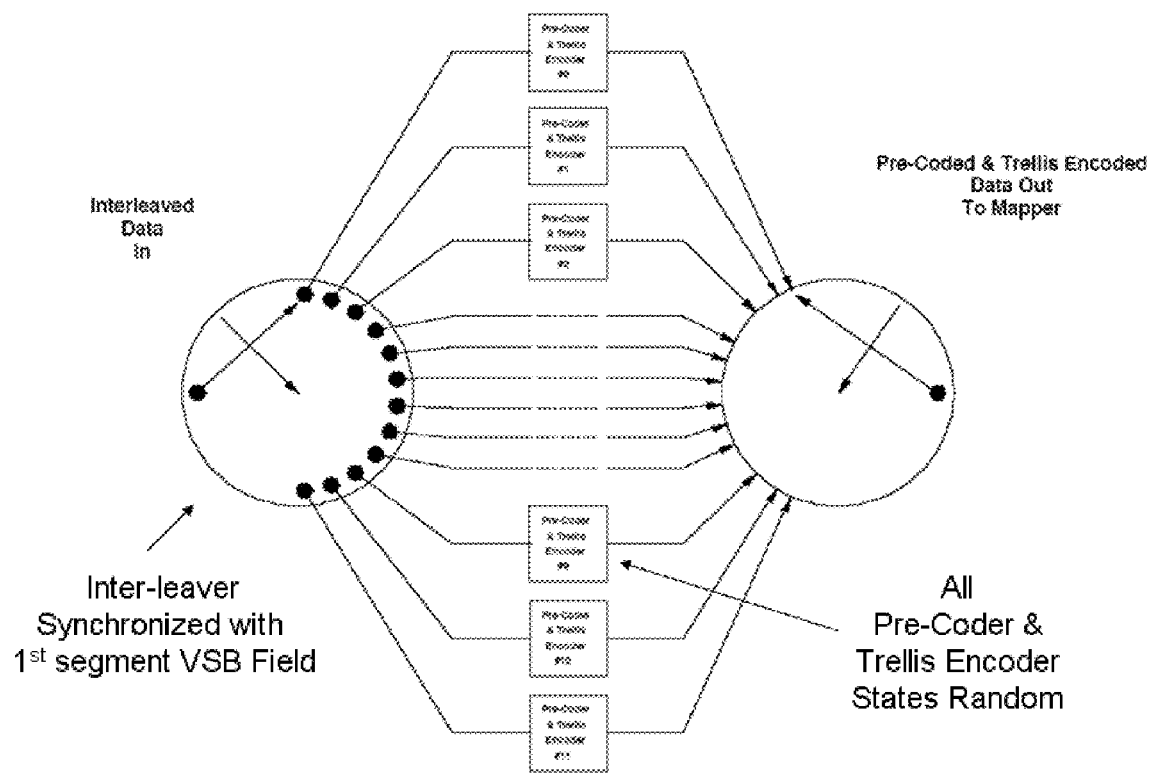
FIG. 2 shows a block diagram of pre-coders and trellis encoders.

Deterministic trellis reset is an operation that resets the trellis-coded modulation (TCM) encoder states (pre-coder and trellis encoder states) in the ATSC exciter at selected temporal locations in the VSB frame. FIG. 2 shows that the states of the (12) pre-coder and trellis encoders are random. No external knowledge of these states can be obtained due to the random nature of these states in the current A/53 exciter. The DTR provides a mechanism to force all TCM encoders to a zero state (a known deterministic state).

State Reset Operation

Figure 4:
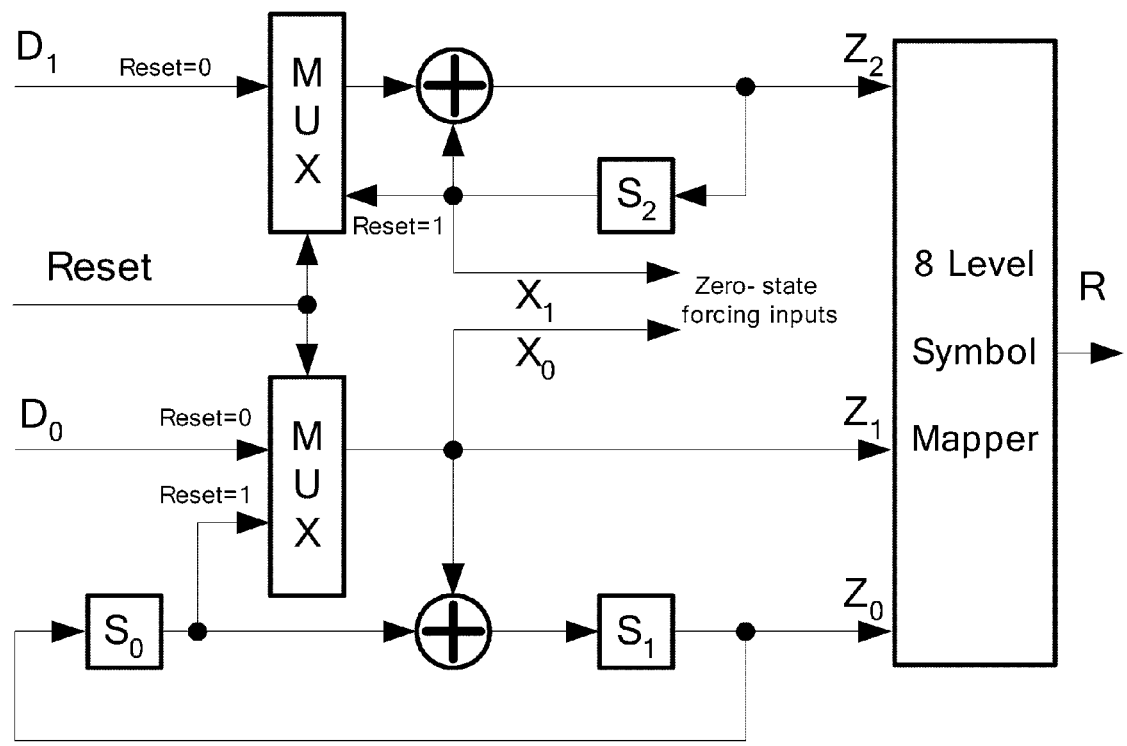
FIG. 4 shows a circuit for performing a deterministic trellis reset.

FIG. 4 shows a circuit of (1 of 12) modified TCM encoders used in an 8-trellis VSB (8T-VSB) system. Two new MUX circuits have been added to existing logic gates in the circuit shown. When Reset is inactive (Reset=0) the circuit operates as a normal 8-VSB coder. When Reset is active (Reset=1), the circuit performs a state reset operation as described below in conjunction with the following Table 1.

TABLE 1

Trellis Reset Table

| Reset at t = 0 | (S0 S1 S2) at t = 0 | (X0 X1) at t = 0 | (S0 S1 S2) at t = 1 | (X0 X1) at t = 1 | (S0 S1 S2) Next State at t = 2 | Output (Z2 Z1 Z0) |
|---|---|---|---|---|---|---|
| 1 | 0, 0, 0 | 0, 0 | 0, 0, 0 | 0, 0 | 0, 0, 0 | 000 |
| 1 | 0, 0, 1 | 0, 1 | 0, 0, 0 | 0, 0 | 0, 0, 0 | 000 |
| 1 | 0, 1, 0 | 0, 0 | 1, 0, 0 | 1, 0 | 0, 0, 0 | 000 |
| 1 | 0, 1, 1 | 0, 1 | 1, 0, 0 | 1, 0 | 0, 0, 0 | 000 |
| 1 | 1, 0, 0 | 1, 0 | 0, 0, 0 | 0, 0 | 0, 0, 0 | 000 |
| 1 | 1, 0, 1 | 1, 1 | 0, 0, 0 | 0, 0 | 0, 0, 0 | 000 |
| 1 | 1, 1, 0 | 1, 0 | 1, 0, 0 | 1, 0 | 0, 0, 0 | 000 |
| 1 | 1, 1, 1 | 1, 1 | 1, 0, 0 | 1, 0 | 0, 0, 0 | 000 |

The truth table of the two XOR gates in FIG. 4 states that "when both inputs are at like logic levels (either 1 or 0), the output of the XOR gate is always 0 (zero)". Note that there are three D latches (S0, S1, S2) in FIG. 4 that form the memory of the TCM encoder. These can be in one of two possible states, (0 or 1). Therefore, as shown the second column in Table 1, there are (8) possible starting states of Trellis Coder Memory (TCM). Table 1 shows the logical outcome when the Reset signal is held active (Reset=1) for two consecutive symbol clock periods. Independent of the starting state of the TCM, it is forced to a known Zero state (S0=S1=S2=0). This is shown in next to last column labeled Next State. Hence a Deterministic Trellis Coder Reset (DTR) can be forced over two symbol clock periods. When the Reset is not active the circuit performs normally.

Additionally, zero-state forcing inputs (X0, X1 in FIG. 4) are available. These are TCM Encoder inputs which forces Encoder state to be zero. During the 2 symbol clock periods, they are produced. In fact the DTR operation can be explained as follows. At the instant to reset, the inputs of TCM Encoder are discarded and the zero-state forcing inputs are fed to a TCM Encoder over two symbol clock periods. Then TCM Encoder state is guided to be zero by zero-state forcing inputs. These inputs are important to correct parity errors induced by DTR.

Reset Timing

The right timing to reset is selected when we want to get the sought effect. Some applications are described below.

If introduced immediately after DTR, a selected bit sequence, based on this known starting state of the TCM, will generate a known pattern of symbols. This is used to generate SRS. The instant to reset is thus the first 2 symbols (4 bits) from each TCM Encoder (1 of 12) that process SRS. This process will create a pattern known to receivers in known locations of VSB Frame, which would help the equalizer.

Supplementary Reference Sequence (SRS)

The current ATSC 8-VSB system needs improvement to provide a reliable reception in fixed, indoor, and portable environments in the dynamic multi-path interference. The basic principle of SRS is to periodically insert a special known sequence in a deterministic VSB frame in such a way that a receiver equalizer can utilize this known sequence to mitigate dynamic multi-path and other adverse channel conditions. The equalizer uses these contiguous sequences to adapt itself to a dynamically changing channel.

Figure 3:
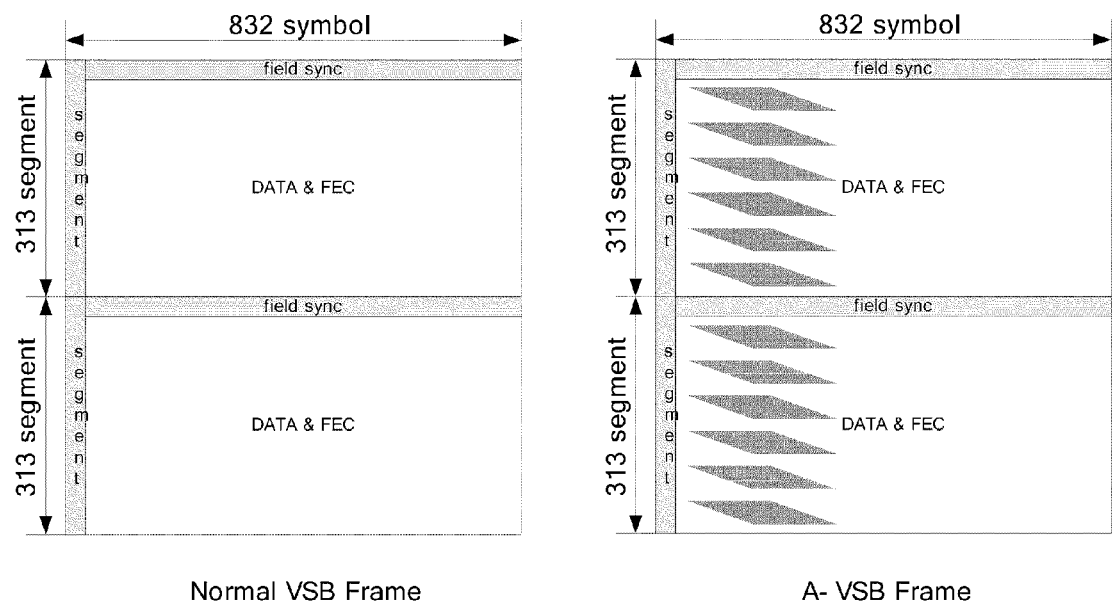
FIG. 3 shows a normal VSB and an A-VSB frame.

When the TCM encoder states have been forced to a known Deterministic State (DTR) an appended precalculated "known sequence" of bits (SRS pattern) is then processed immediately in predetermined way at specific temporal locations at the Interleaver input of the frame. The resulting symbols, at the Interleaver output, due to the way the ATSC Interleaver functions will appear as known contiguous symbol patterns in known locations in VSB frame, which is available to the receiver as additional equalizer training sequence. FIG. 3 shows the normal VSB frame on left and the A-VSB frame on the right with SRS turned on. The A-VSB frame has frequently appearing SRS available to a new A-VSB design ATSC receiver. The data to be used in transport stream packets to create these known symbol sequence is introduced into the system in a backward compatible way using existing standard mechanisms. This data is carried in the MPEG2 adaptation field. Hence existing standards are leveraged, and compatibility is assured.

The RS encoder preceding the interleaver calculates the RS parity. Due to resetting the TCM encoders, the calculated RS parity bytes are wrong and need to be corrected. Thus, an additional processing step is required to correct parity errors in selected packets. All packets with parity errors will have their RS parity re-encoded. A (52) segment byte interleaver with unique time dispersion properties that generates a contiguous SRS pattern is leveraged to provide adequate time to re-encode parity bytes. The time required to do this constrains the maximum number of SRS bytes.

System Overview for SRS

Figure 5:
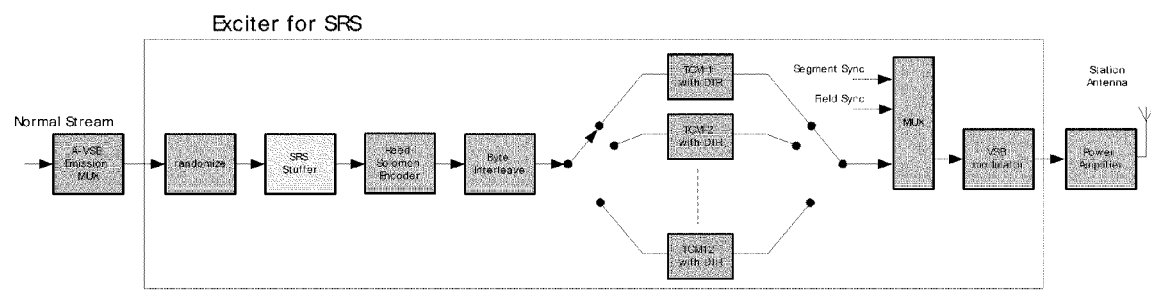
FIG. 5 shows a block diagram of an ATSC DTV transmitter using a supplementary reference sequence (SRS)

To add the SRS feature to the ATSC DTV RF/Transmission system (VSB system), an ATSC DTV Transmitter is modified as shown in FIG. 5. The MUX and TCM blocks are modified and a new SRS stuffer block is provided. The ATSC Emission Multiplexer scheduling algorithm takes into consideration a predefined deterministic frame template for SRS. The generated packets are prepared for the SRS post-processing in an A-VSB exciter.

The packets are first randomized and then the SRS stuffer fills the stuffing area in the adaptation fields of packets with a predefined sequence (SRS pattern data). Along with all data packets the SRS-containing packets are also processed for forward error correction with the (207, 187) Reed-Solomon code. After byte interleaving, they are encoded in the ⅔ rate trellis encode block. At every SRS-appearing instant, the deterministic trellis reset (DTR) occurs to generate a known symbol output.

DTR necessarily entails some symbol changes (2 symbols for each TCM encoder) at the SRS appearing instant. Since these changes occur after Reed-Solomon encoding, the previously calculated RS parity bytes are no longer correct. In order to correct these erroneous parity bytes, they are re-calculated and replace the old parity bytes in the "TCM with DTR" block in FIG. 5. The following blocks are the same as the standard ATSC VSB exciter and the data pass through them. Now each block is examined one by one.

ATSC Emission Mux for SRS

Figure 6:
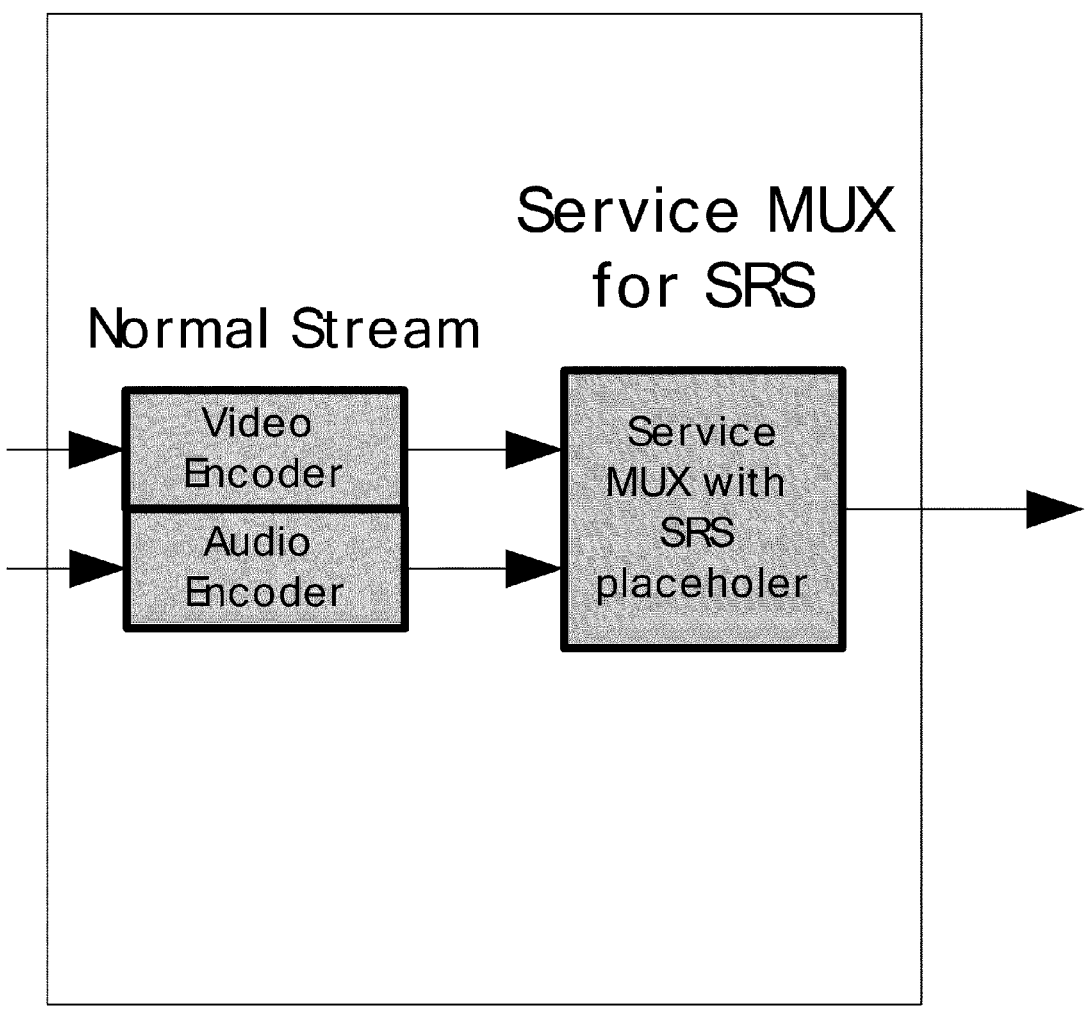
FIG. 6 shows a block diagram of an ATSC emission multiplexer using SRS.
Figure 7:
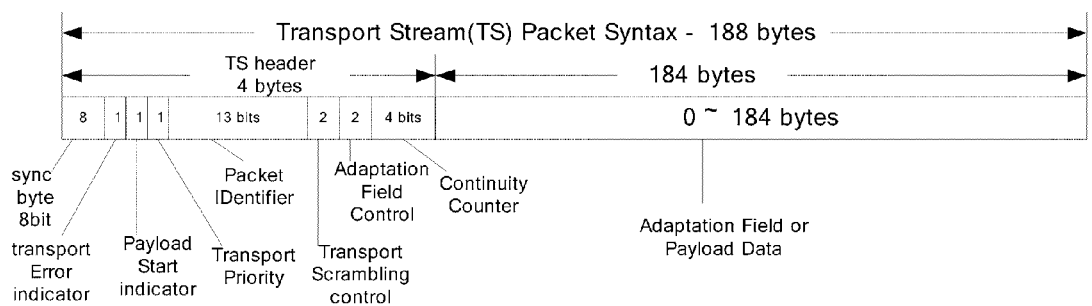
FIG. 7 shows a normal TS packet syntax.
Figure 8:
FIG. 8 shows a TS packet without SRS.
Figure 9:
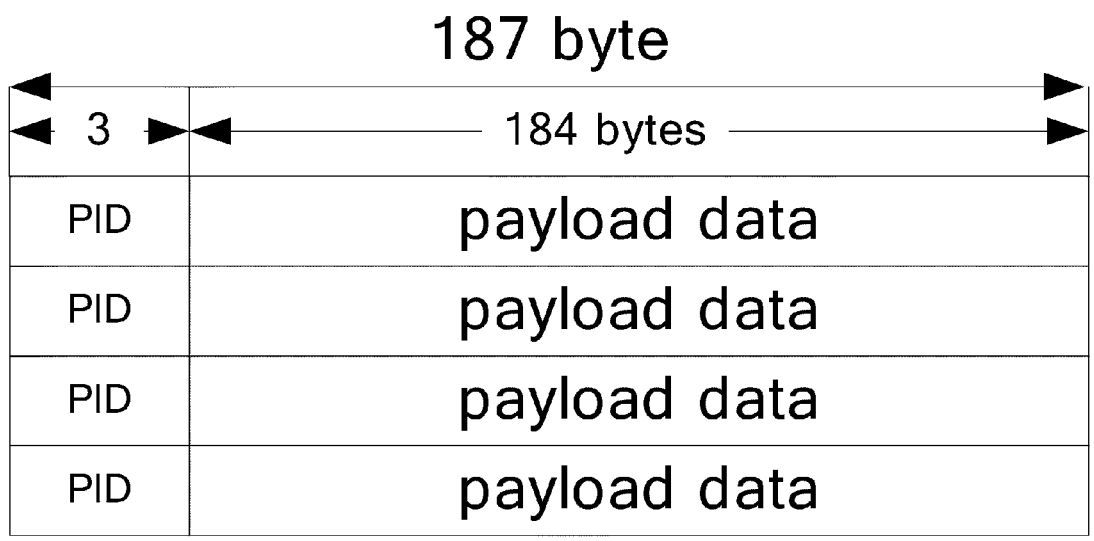
FIG. 9 shows a normal transport stream.

ATSC Emission Mux for SRS is shown in FIG. 6. In principle the Service Mux places AF (Adaptation Field) in all TS packets for later SRS processing. The MPEG2 TS packet syntax is shown in FIG. 7. A MPEG2 TS packet without AF is depicted in FIG. 8 which complies with the syntax. This packet has 1 byte of the MPEG sync, 3 bytes of the header, and the 184 bytes of payload (188-byte length). The transport stream with packets without AF is shown in FIG. 9.

Figure 10:
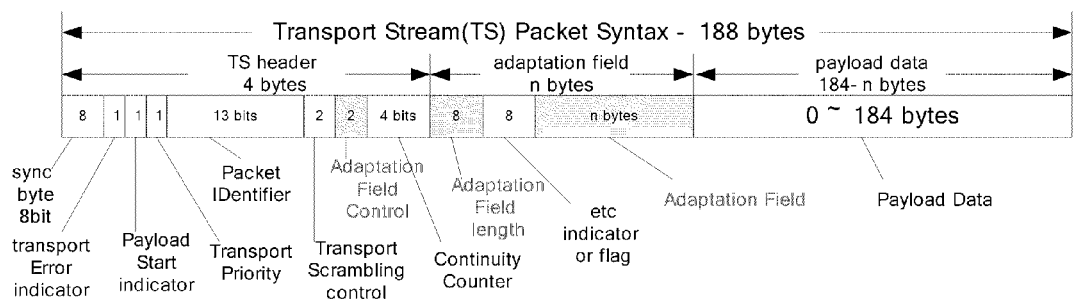
FIG. 10 shows a normal TS packet syntax with an adaptation field.
Figure 11:
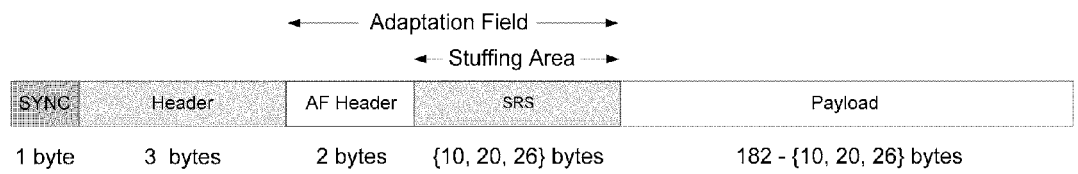
FIG. 11 shows an SRS-carrying TS packet.
Figure 12:
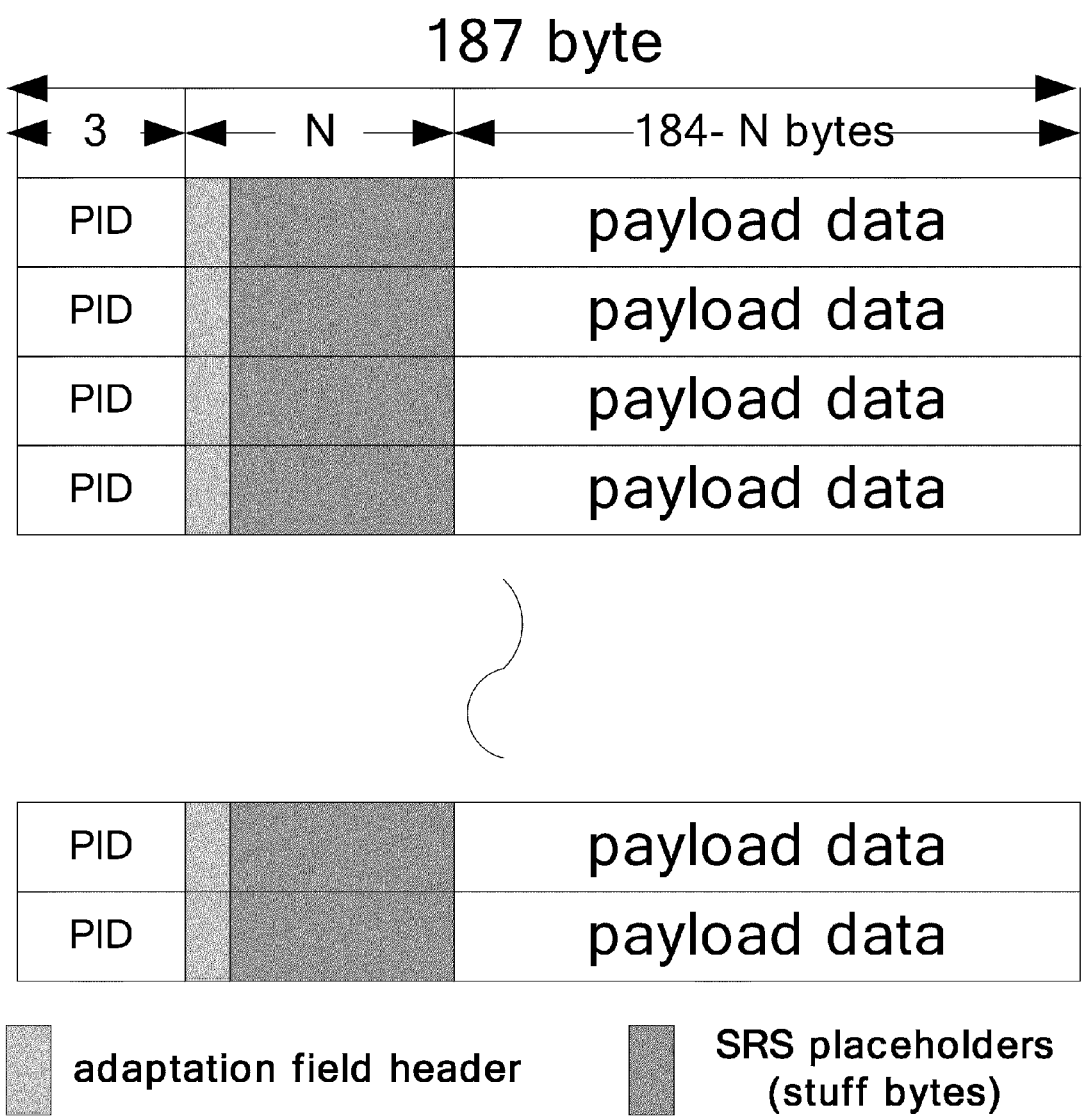
FIG. 12 shows a transport stream with SRS packets.

The adaptation field control in TS header turns on (n) bytes of adaptation field. The packet syntax with AF is shown in FIG. 10. The adaptation field is mainly used to adjust a payload size during packetized elementary stream (PES) encapsulation and to carry the PCR and so on. The typical SRS packet is depicted in FIG. 11 and the transport stream with the SRS packets is depicted in FIG. 12, which will be outputs of the Emission Mux for SRS.

Frame Structure for SRS

An 8-VSB Frame is composed of 2 Data Fields, each data field having a Data Field Sync and 312 data segments. This document now defines a new term, VSB Slice. A VSB slice is defined as a group of 52 data segments. So a VSB Frame has 12 slices, this 52 data segment granularity fits well the special characteristics of the 52 segment VSB-Interleaver.

In the real situation, there are several pieces of information to be delivered through AF along with SRS to be compatible with the MPEG2 system specification. These can be PCR, OPCR, splice counter, private data, and so on. From the ATSC and MPEG2 perspective of an Emission MUX, the PCR (Program Clock Reference) and Splice counter must be carried when needed along with the SRS. This imposes a constraint during the TS packet generation since the PCR is located at the first 6 SRS bytes. This is easily solved owing to the Deterministic Frame (DF) aspect. Since A-VSB frame structure has to be deterministic, positions of data segments with PCR are fixed. An exciter designed for SRS knows the temporal position of {PCR, splice counter} and properly fills SRS pattern bytes. One slice of SRS DF is shown in FIG. 20. The SRS DF template stipulates that the 15-th (19-th) segment in every slice can be a PCR (Splice counter)-carrying packet. This is based on the fact that broadcasters generally use only the PCR and splice counter of the MPEG2 standard. However, the MPEG2 standard provides for many other types of data to be transmitted in the TS packets, such as OPCR, field adaptation extension length, private data, etc., and if such data is required, the SRS DF template may be modified to protect such data from being overwritten by SRS data.

Figure 14:
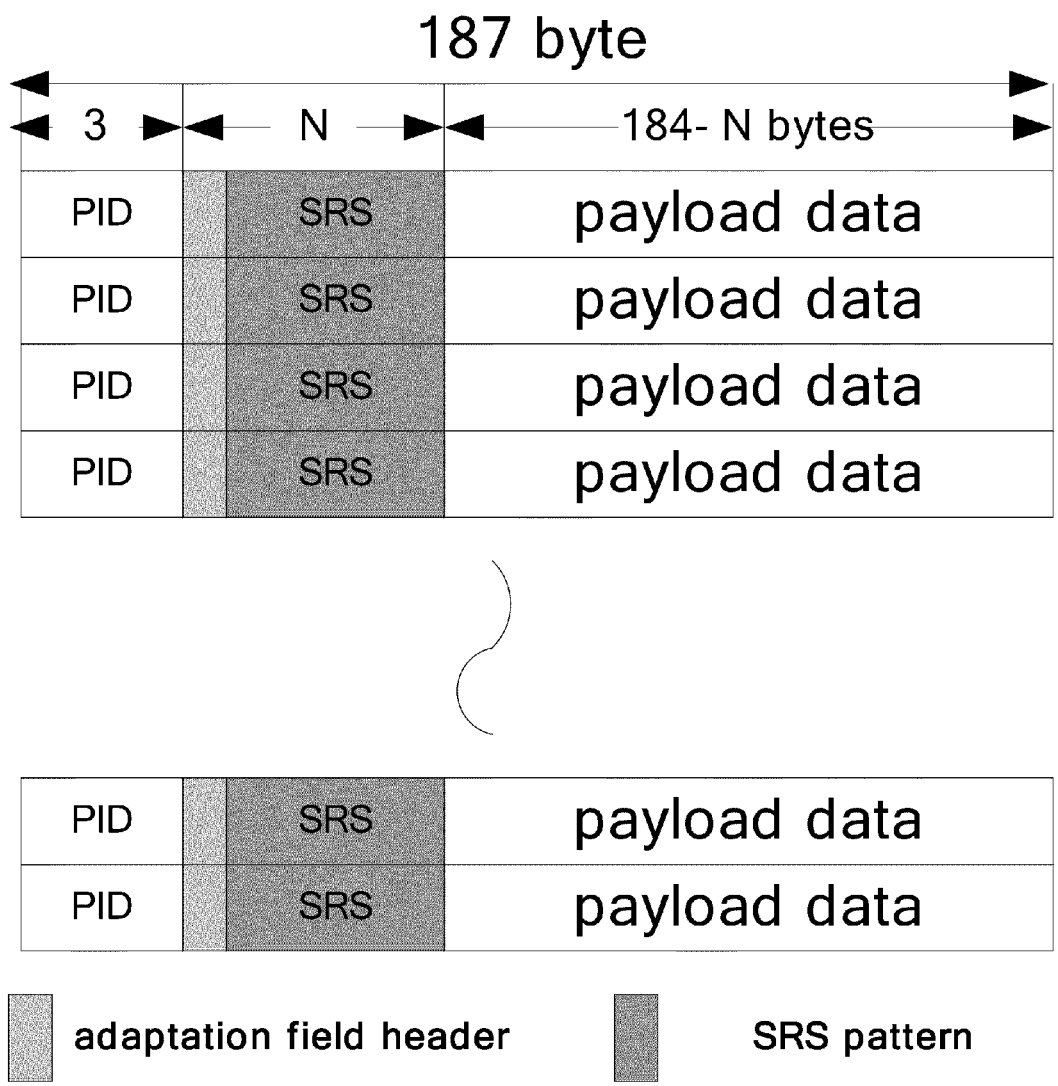
FIG. 14 shows a transport stream carrying SRS.

Obviously, a normal payload data rate with SRS will be reduced depending on (N−2) bytes of SRS pattern in FIG. 14. The N−2 can be 0 through 26 0 (no SRS) being normal ATSC 8-VSB. The recommended (N−2) bytes of SRS are {10, 20, 26} bytes. The following Table 2 lists four SRS modes corresponding to (N−2) bytes of {0, 10, 20, 26}.

TABLE 2

Recommended SRS-n

| SRS Mode | Mode 0 | Mode 1 | Mode 2 | Mode 3 |
|---|---|---|---|---|
| SRS Length | 0 byte | 10 bytes | 20 bytes | 26 bytes |
| Payload Loss | 0 Mbps | 1.24 Mbps | 2.27 Mbps | 2.89 Mbps |

SRS modes are signaled to the exciter from the Emission Multiplexer, and Walsh coded in the DFS Reserved bytes for A-VSB. The detailed signaling scheme is described below in the section entitled "A-VSB Mode Signaling Scheme". Table 2 shows also the payload loss associated with each mode. Since 1 slice takes 4.03 ms, the payload loss due to SRS 10 bytes is 1.24 Mbps as calculated by the following expression:

$$\frac{(10+2)\text{bytes} \cdot 52 \text{ packets}}{4.03 \text{ ms}} \cdot 8 = 1.24 \text{ Mbps}$$

Similarly, the payload loss of SRS {20, 26} bytes is {2.27, 2.89} Mbps.

Exciter for SRS
SRS Stuffer

Figure 13:
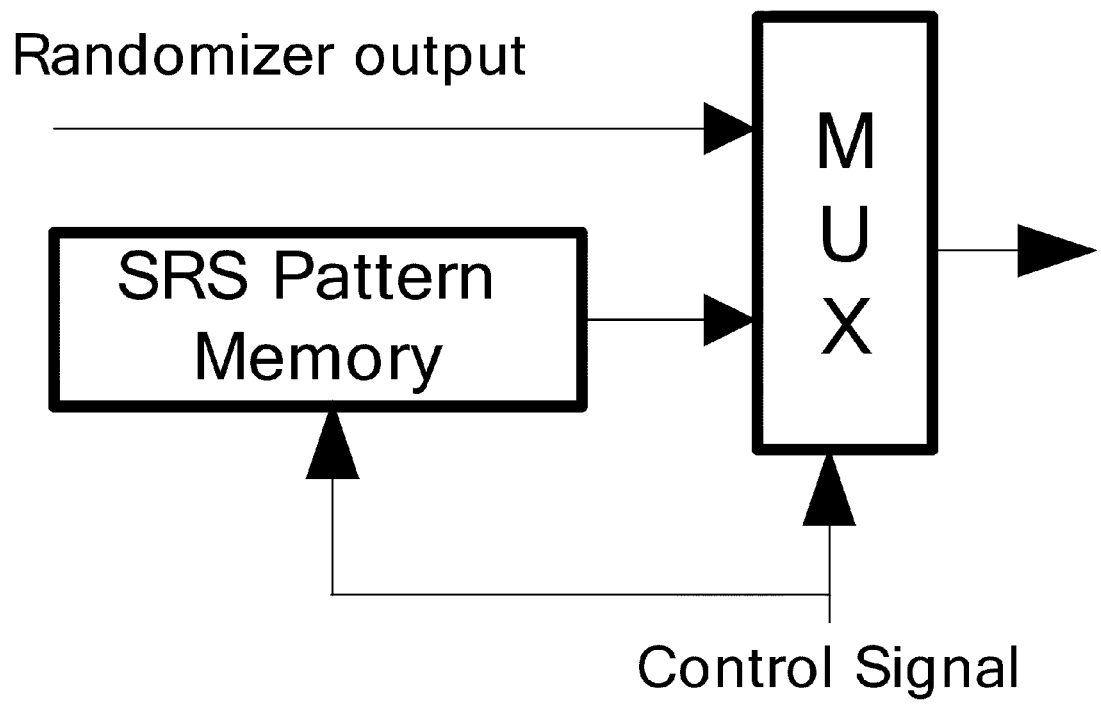
FIG. 13 shows a block diagram of an SRS stuffer.

The basic operation of the SRS stuffer is to fill the SRS pattern bytes to the stuffing area of the AF in each TS packet. In FIG. 13, the SRS pattern memory is activated by the control signal at the SRS stuffing time. The control signal also switches the output of the SRS stuffer to the SRS pattern memory. FIG. 14 depicts the transport stream carrying the SRS pattern bytes in the AF.

The SRS stuffer must not overwrite a PCR when a PCR carrying packet is sent in a multiplex. Since the exciter knows that the 15-th packet in a slice from the Emission Multiplexer carries a PCR, the SRS stuffer can protect a PCR of the packet. Similarly, a Splice Counter is also protected.

Figure 21:
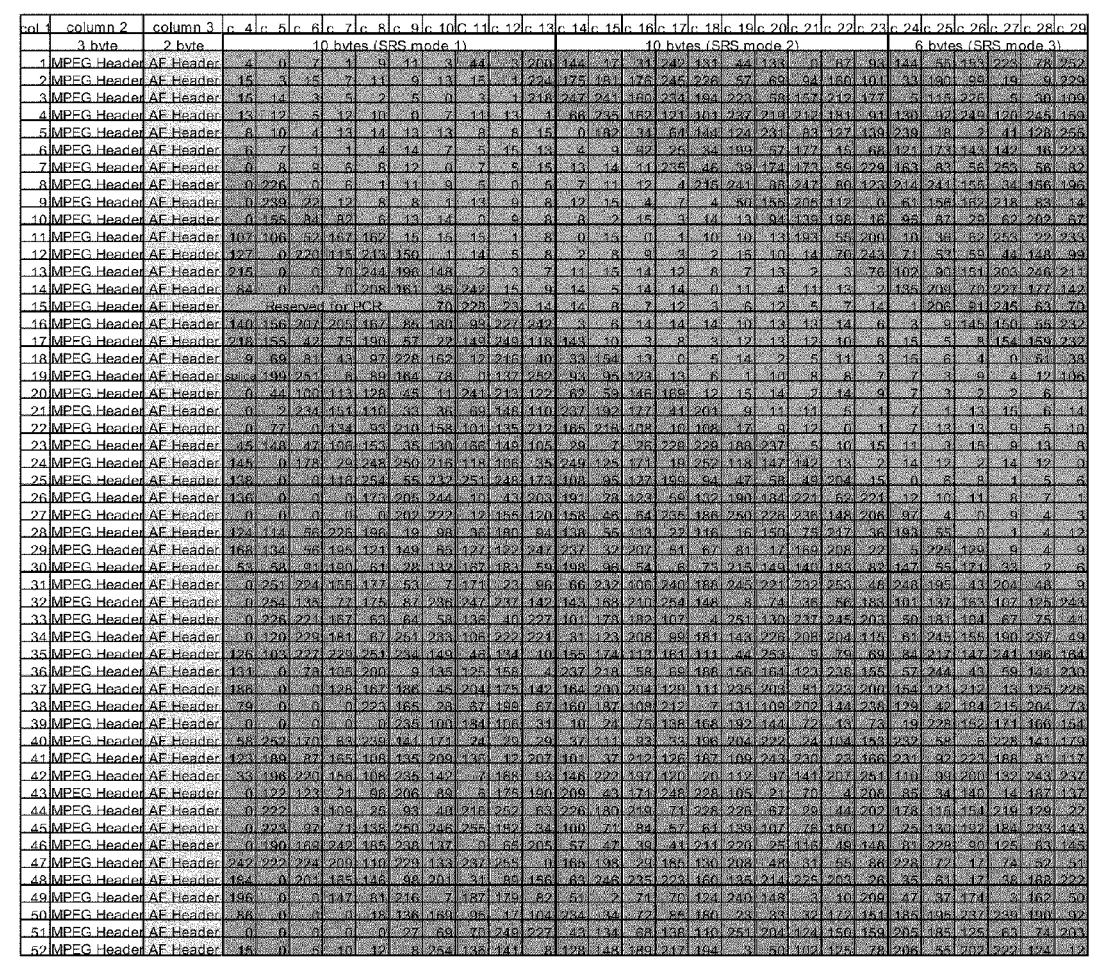

FIG. 21 shows the pattern byte values stored in SRS memory. These values are designed to give a good performance for the equalization in a receiver. The values in the light gray diagonal band, ranging from 0 to 15, are fed to the TCM encoders at DTR. The 4 MSB bits of these bytes having values 0~15 are effectively replaced with the zero-state forcing inputs in an Exciter.

Depending on the selected SRS mode, different ones of these SRS pattern byte values are used. For example, in the SRS mode 1, 10 bytes of SRS per packet are used which results in values from the 4th to the 13th columns in FIG. 21. In case of the SRS mode 2, the values from the 4th to the 23rd columns are used.

Reed-Solomon Encoder

Figure 15:
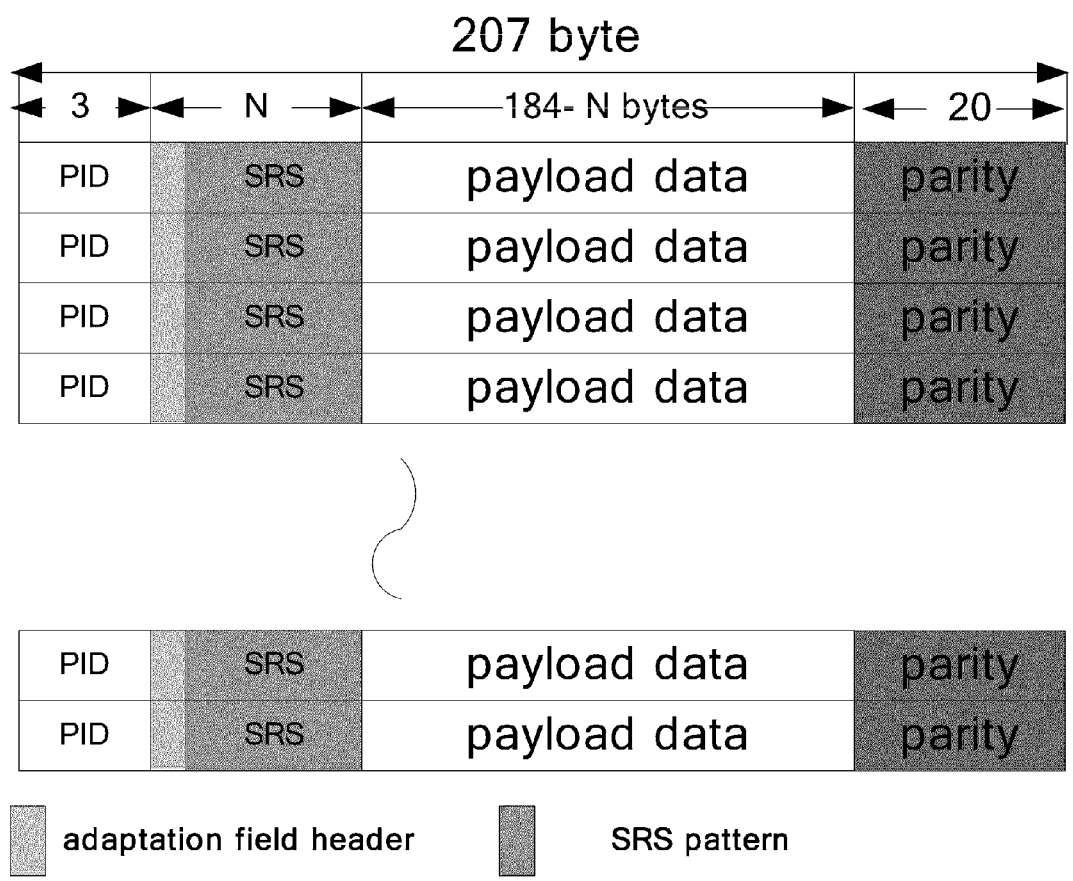
FIG. 15 shows a transport stream carrying SRS with parity added by the Reed-Solomon encoder in FIG. 5.

A transport stream carrying SRS is then fed to the RS Encoder in FIG. 5. The output of RS encoders is shown in FIG. 15 which is a just parity-attached version of SRS-carrying transport stream.

Byte Interleaver

Figure 16:
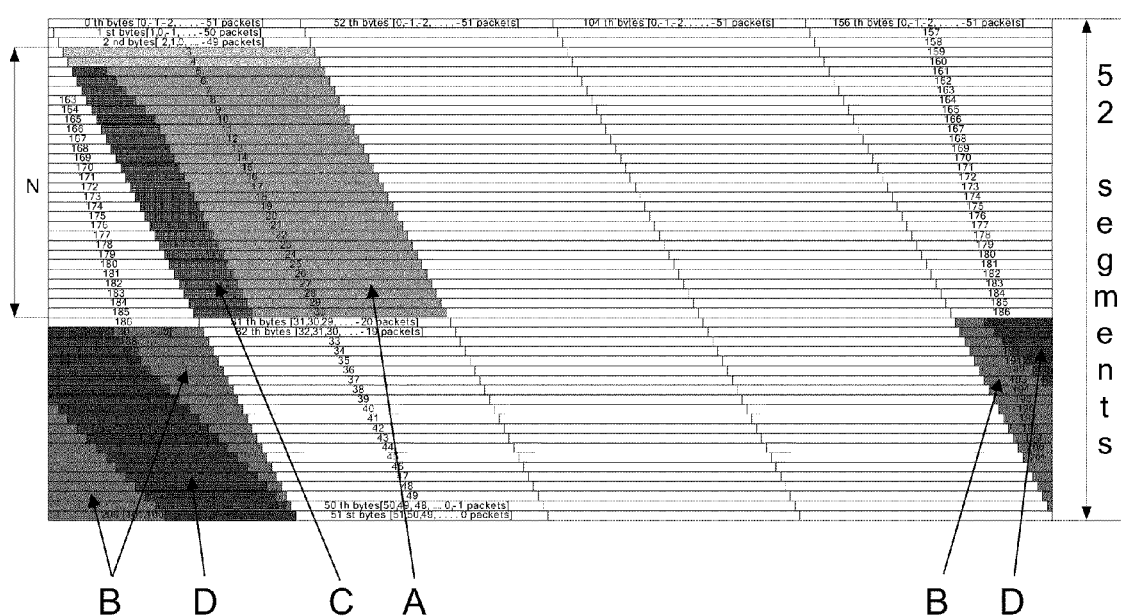
FIG. 16 shows ATSC byte interleaver output for N=26 (SRS)+2(AF header)

FIG. 16 shows the byte interleaver outputs. See the discussion below in the section entitled "ATSC Byte Interleaver Mapping" to understand the exact interleaver mapping. FIGS. 50-55 discussed in that section graphically show how to manipulate the input bytes to obtain the final interleaved bytes.

Figure 17:
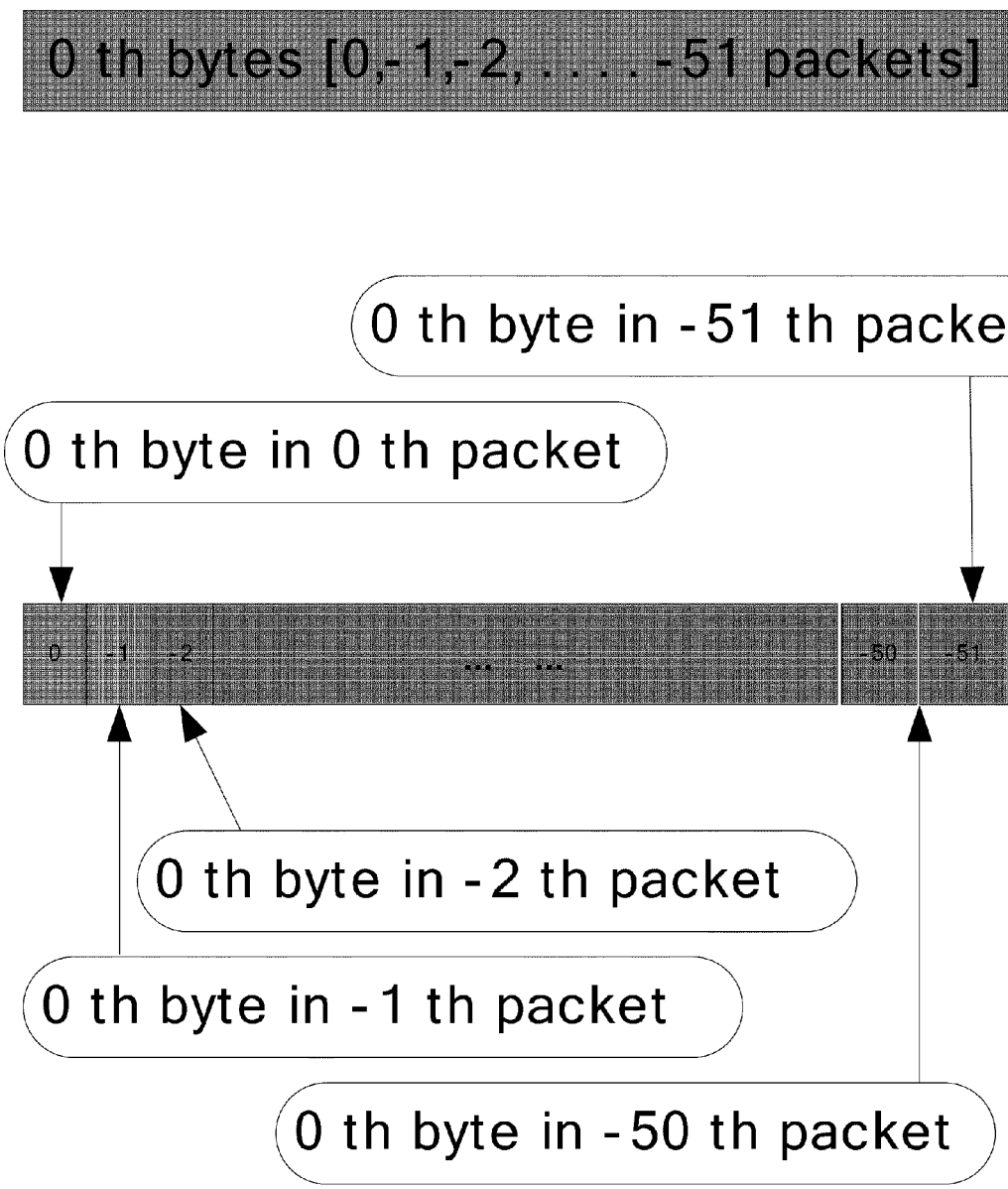
FIG. 17 shows the meaning of "0th bytes [0, −1, −2, . . . −51 packets]"

The region labeled "A" in FIG. 16 contain SRS pattern bytes, while the regions labeled "B" contain parity bytes. The region labeled "C" contains bytes to be replaced by DTR, and the regions labeled "D" contain the parity bytes to be re-calculated in order to correct the parity mismatch introduced by DTR. FIG. 17 explains how to interpret "0th bytes [0, −1, −2, ... −51 packets]" in FIG. 16. A negative packet number means nothing but a relative order among packets. The −1-th packet is the packet preceding the 0-th packet.

Note that (N) bytes of SRS pattern in FIG. 15 are arranged in the vertical way by the ATSC byte interleaver mapping that provides contiguous SRS bytes. Each (N) segment serves as a training sequence of 52 contiguous bytes.

Trellis Encoder Block with Parity Correction

Figure 18:
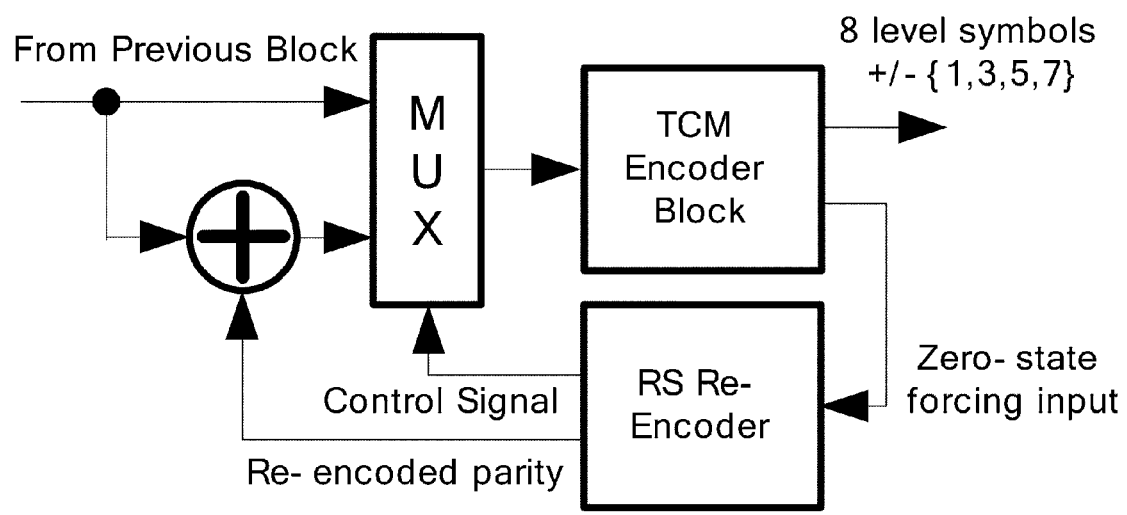
FIG. 18 shows a block diagram of a trellis-coded modulation (TCM) encoder block with parity correction.

FIG. 18 shows the block diagram of TCM encoder block with parity correction. The RS re-encoder receives zero-state forcing inputs. After synthesizing an RS code information word from them, the RS re-encoder calculates parity bytes. When the parity bytes to be replaced arrive, they are replaced by the values generated by the exclusive-OR of these parity bytes and the re-calculated parity bytes from the RS re-encoder.

Figure 19:
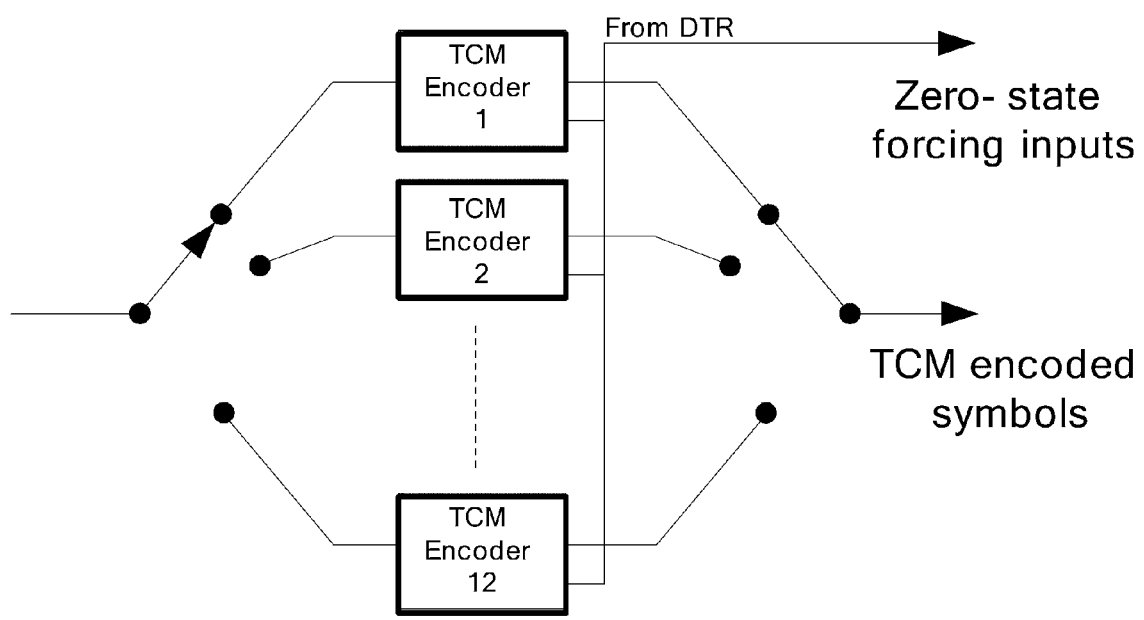
FIG. 19 shows a detailed block diagram of the TCM encoder block in FIG. 18.

The trellis encoder block in FIG. 18 includes a 12-way data splitter, 12 TCM encoders, and a 12-way data de-splitter as shown in FIG. 19. TCM encoder behavior is described in Annex D of ATSC A/53E previously referred to above. The 12 trellis encoders for A-VSB have DTR functionality. The zero-forcing inputs are fed to the next block, which calculates the re-encoded parity bytes.

A-VSB Mode Signaling Scheme

The SRS feature described above assumes that each mode is known to an A-VSB receiver. The A-VSB mode signaling scheme fulfills this task.

Standard of Mode Signaling

The information about the current mode is transmitted in the Reserved (104) symbols of each Data Field Sync. Specifically:
1. Allocate symbols for mode of each enhancement: 82 symbols
   A. 1st~82nd symbols
   2. Enhanced data transmission methods: 10 symbols
   A. 83rd~84th symbols (2 symbols): reserved
   B. 85th~92nd symbols (8 symbols): Enhanced data transmission methods
   C. In even data fields (negative PN63), the polarities of symbols 83 through 92 shall be inverted from those in the odd data fields
   3. Pre-code: 12 symbols For more information, refer to "Working Draft Amendment 2 to ATSC Digital Television Standard (A/53C) with Amendment 1 and Corrigendum 1" available at the ATSC website (www.atsc.org)

A-VSB Mode Signaling Bit Structure

Walsh codes of (16) bits are used in the field sync to distinguish between different SRS modes. The first (16) bit slots are assigned for SRS modes. The other unspecified bits are reserved for future use. The A-VSB mode signaling bit structure is summarized in FIG. 22. The Walsh codes of (16) bits are shown in FIG. 23, wherein the "Modulation Symbol Index" is the Walsh code number (#), and the "Walsh Chip within Symbol" is the individual elements of the Walsh codes.

Allocation of Walsh Code for A-VSB Mode

The mapping between a Walsh code and an A-VSB mode is as follows.

Number of SRS Pattern Bytes← →16 Walsh Code

TABLE 6

Mapping of SRS-n

| SRS Bytes Per Packet | Walsh Code # Used |
|---|---|
| 0 | 1 |
| 10 | 3 |
| 20 | 6 |
| 26 | 14 |

The unused Walsh codes are reserved for other SRS pattern bytes.

Reserved (66 Symbols)

Figure 22:
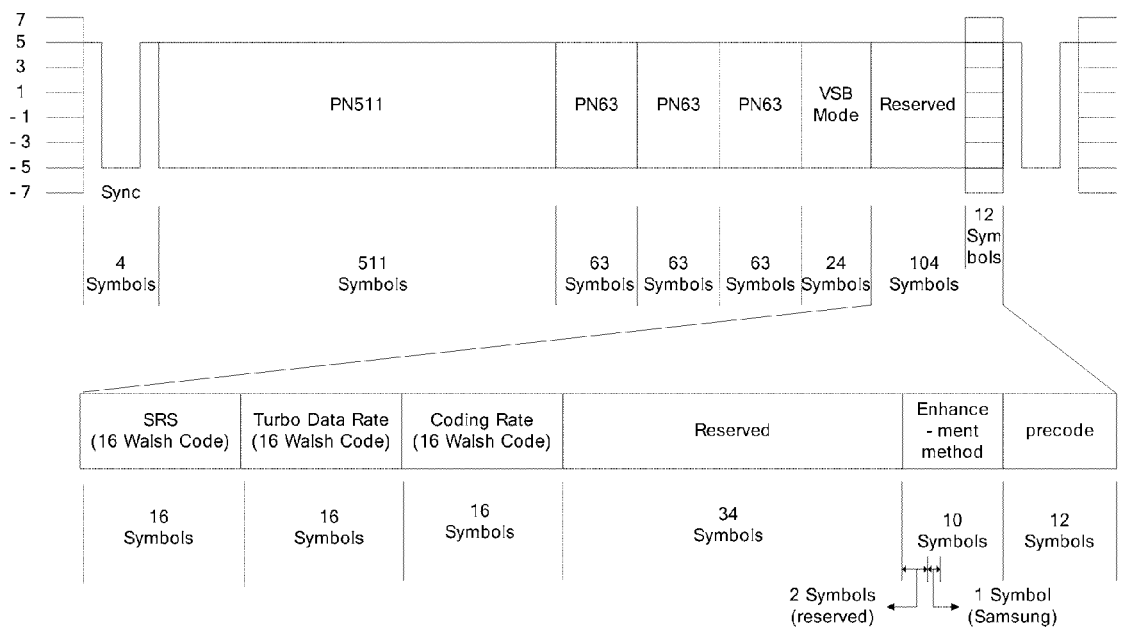
FIG. 22 shows an A-VSB mode signaling bit structure used in an A-VSB mode signaling scheme.

The last 66 symbols of the 82 symbols that are allocated for the mode of each enhancement as discussed above, i.e., the 66 symbols (16+16+34) following the 16 symbols for Walsh codes of (16) bits for SRS modes in FIG. 22, shall be reserved space. It is suggested that this be filled with a continuation of inverting value of 16 Walsh code for SRS.

Mode Change

All Field Syncs transmit the Current Mode. When the Current Mode changes to the Next Mode, the Next Mode is transmitted on even data Field Syncs during 16 frames. Then the Next Mode becomes valid and the system operates with the Next Mode. At the same time, all Field Syncs transmit the Next Mode.

ATSC Byte Interleaver Mapping

Figure 24:
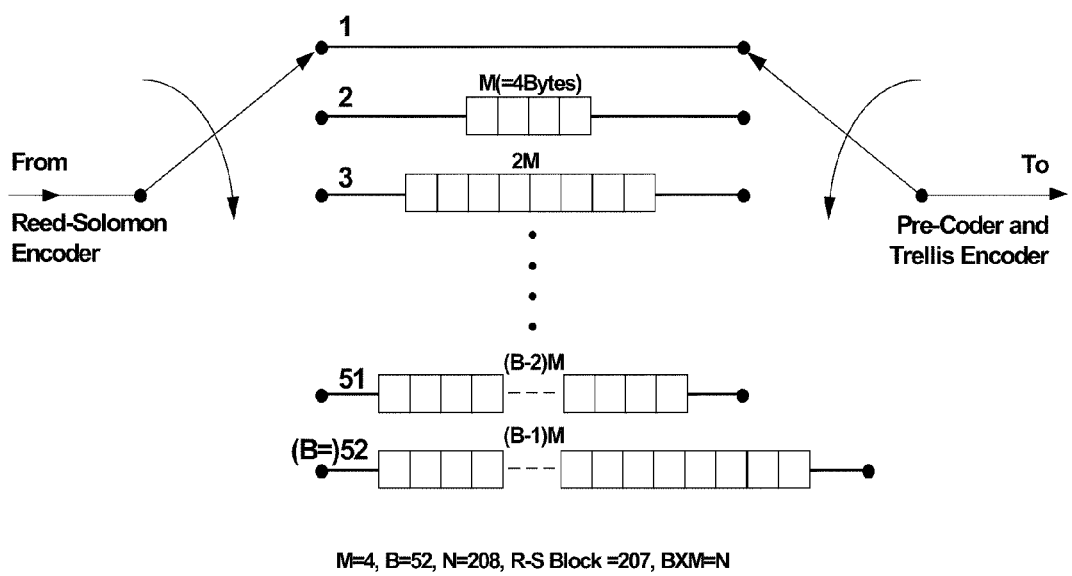
FIG. 24 shows a diagram of an ATSC 52-segment byte interleaver.

FIG. 24 shows a diagram of an ATSC 52-segment byte interleaver that is a part of the ATSC 8-VSB system. Since it is crucial to understand the exact mapping of the Byte Interleaver for A-VSB, a graphical mapping procedure is developed.

Figure 25:
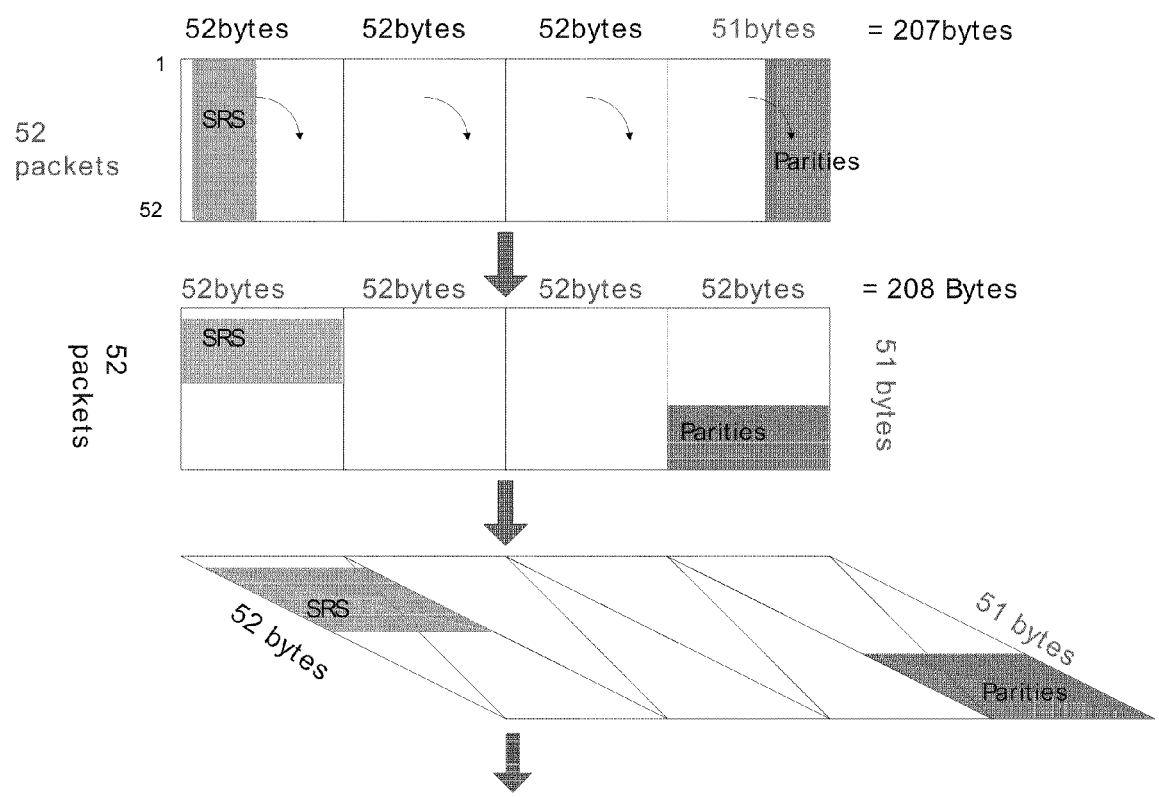
FIG. 25 shows a first stage of manipulation of 52 input packets with SRS in the byte interleaver in FIG. 24.
Figure 26:
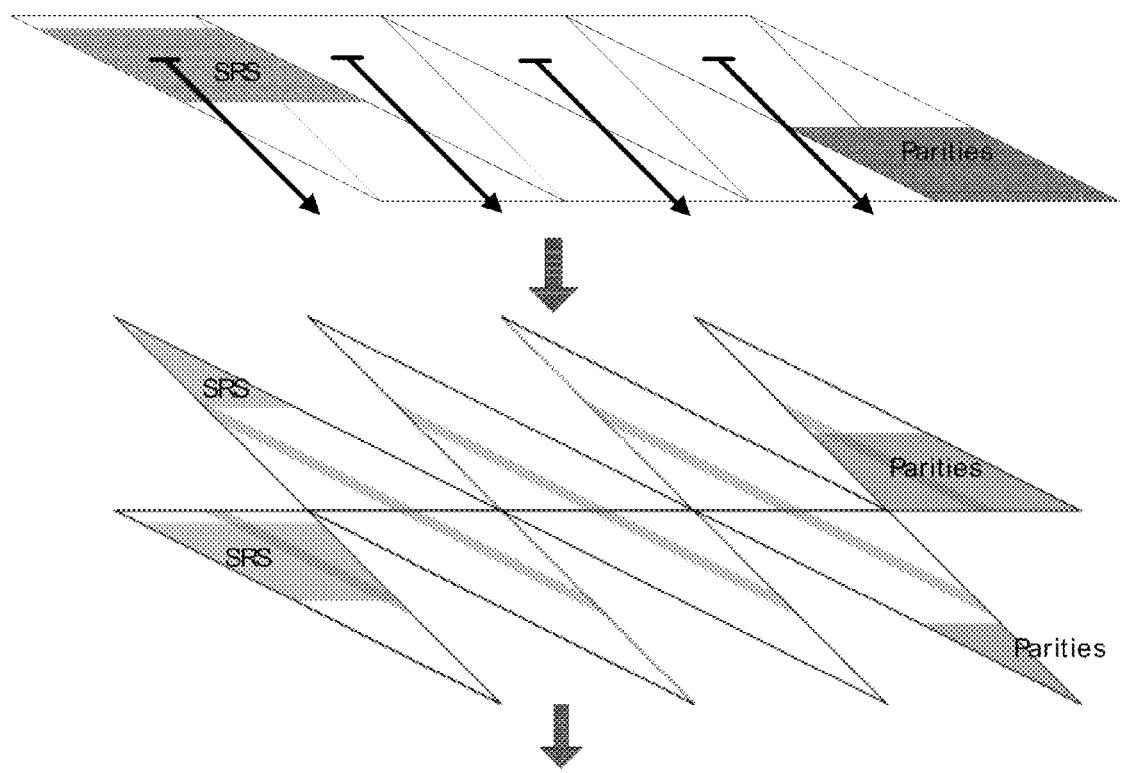
FIG. 26 shows a second stage of manipulation of the 52 input packets with SRS in the byte interleaver in FIG. 24.
Figure 27:
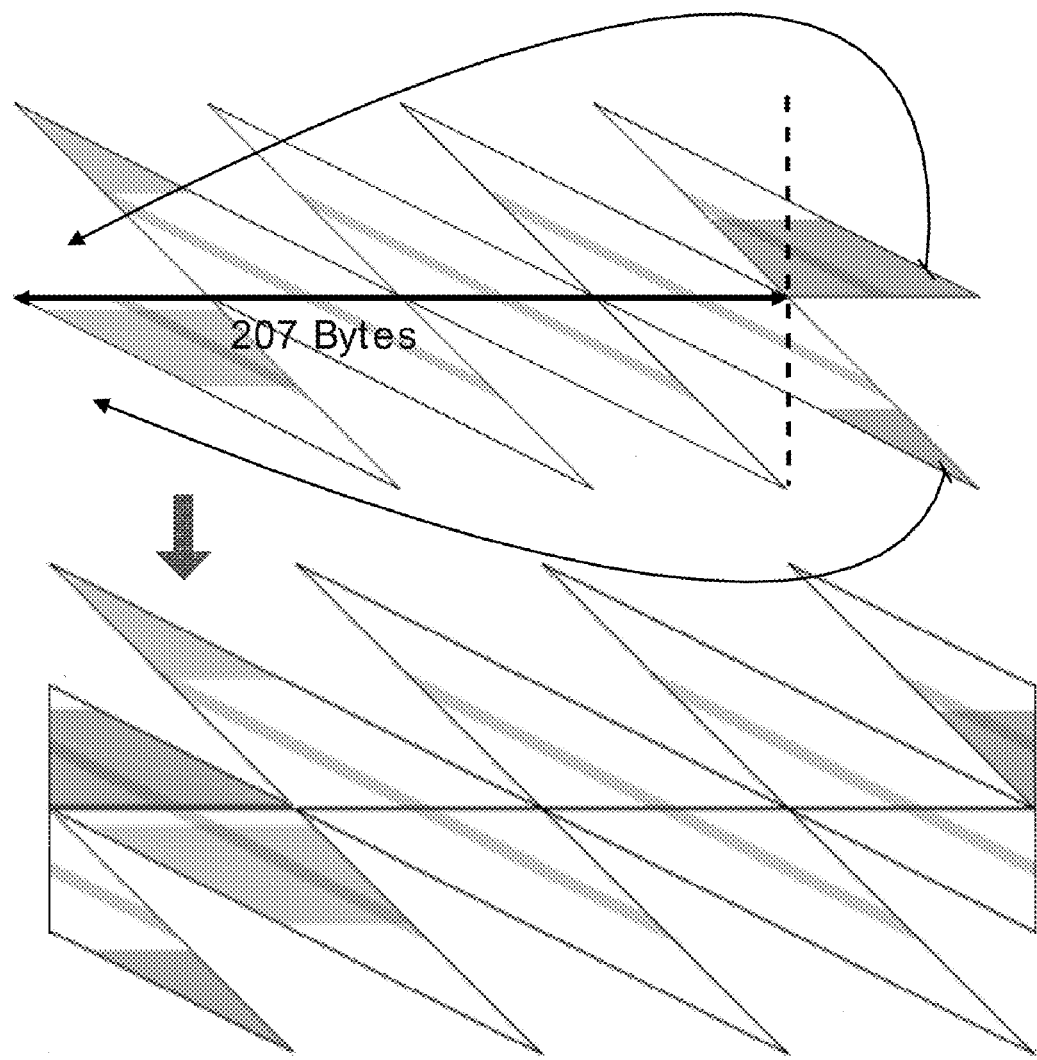
FIG. 27 shows a third stage of manipulation of the 52 input packets with SRS in the byte interleaver in FIG. 24.

FIG. 25 shows a first stage of manipulation of 52 input packets with SRS in the byte interleaver in FIG. 24. FIG. 26 shows a second stage of manipulation of the 52 input packets with SRS in the byte interleaver in FIG. 24. FIG. 27 shows a third stage of manipulation of the 52 input packets with SRS in the byte interleaver in FIG. 24.

Figure 28:
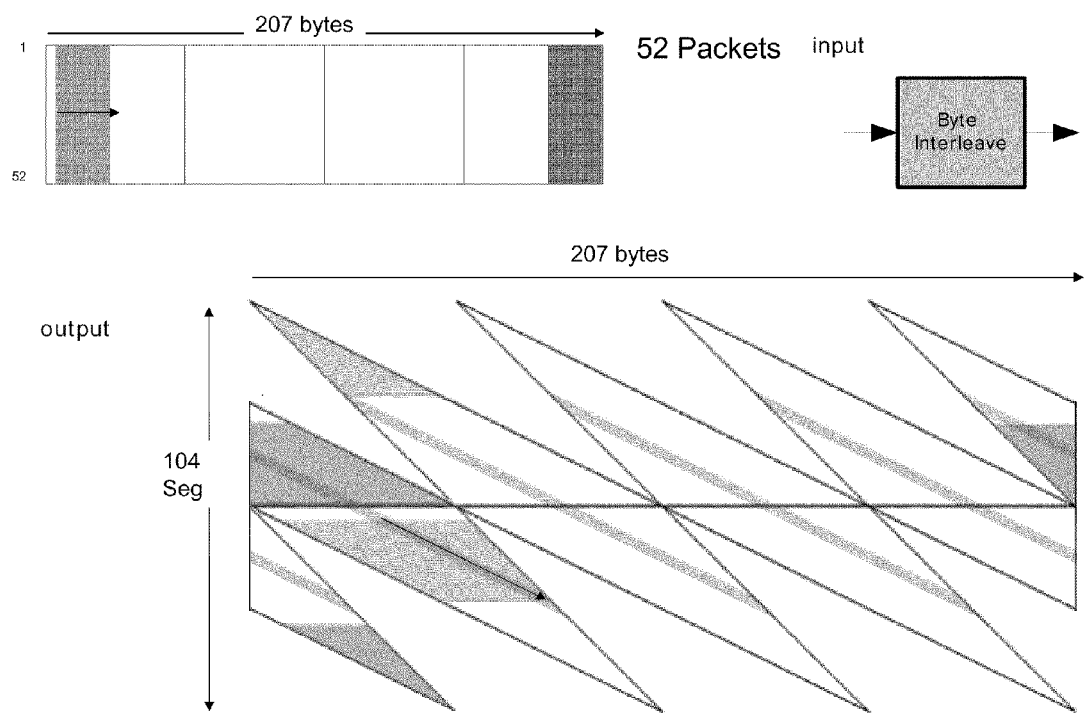
FIG. 28 shows a mapping of 52 input packets performed by the byte interleaver in FIG. 24.
Figure 29:
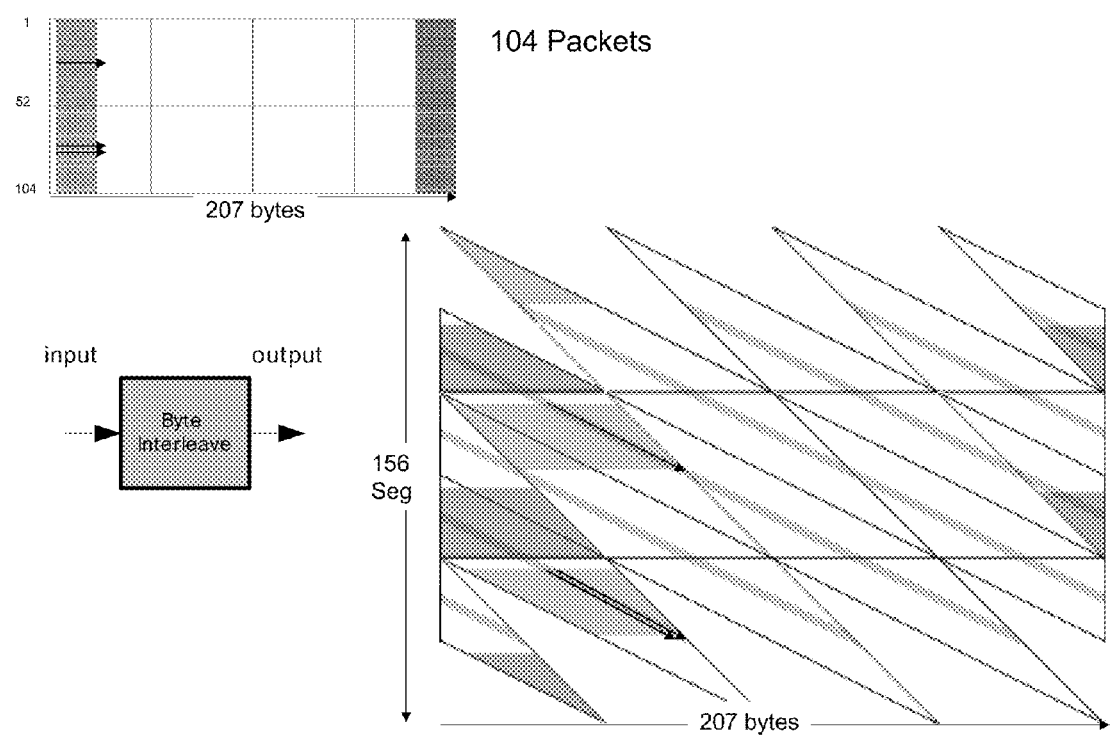
FIG. 29 shows a mapping of 104 input packets performed by the byte interleaver in FIG. 24.

FIG. 28 shows a mapping of 52 input packets performed by the byte interleaver in FIG. 24, and FIG. 29 shows a mapping of 104 input packets performed by the byte interleaver in FIG. 24.

Figure 30:
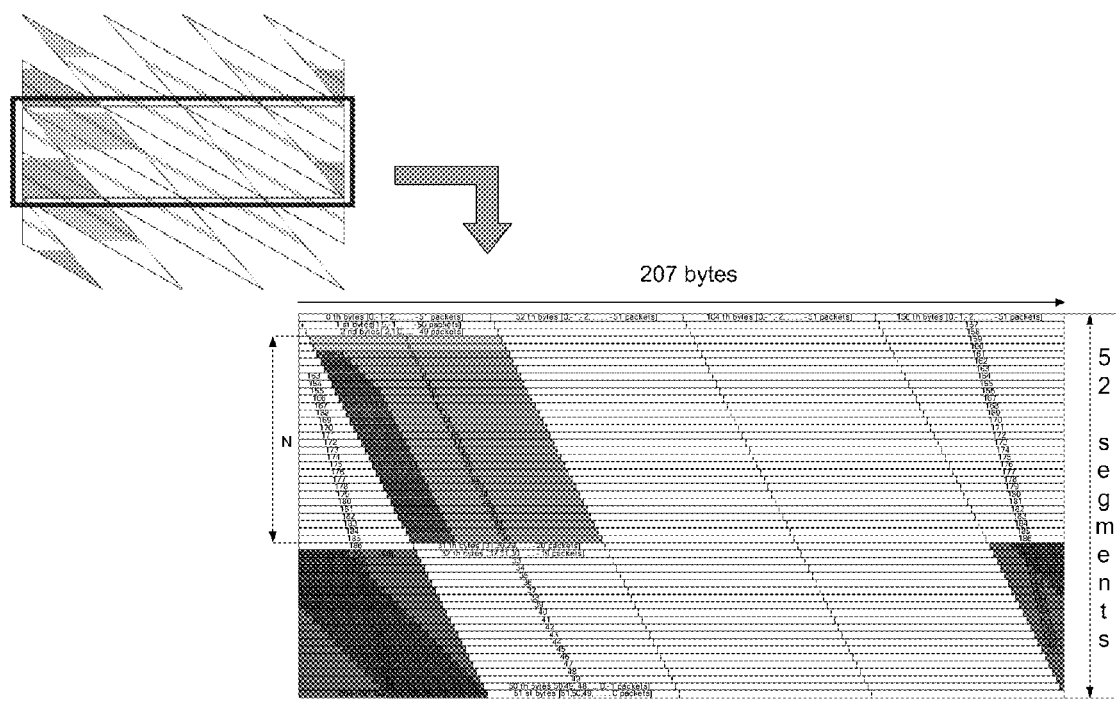
FIG. 30 shows a detail of a mapping performed by the byte interleaver in FIG. 24 when 26 bytes are used for SRS.

FIG. 30 shows a detail of a mapping performed by the byte interleaver in FIG. 24 when 26 bytes are used for SRS.

Digital Broadcasting Receiver

Figure 31:
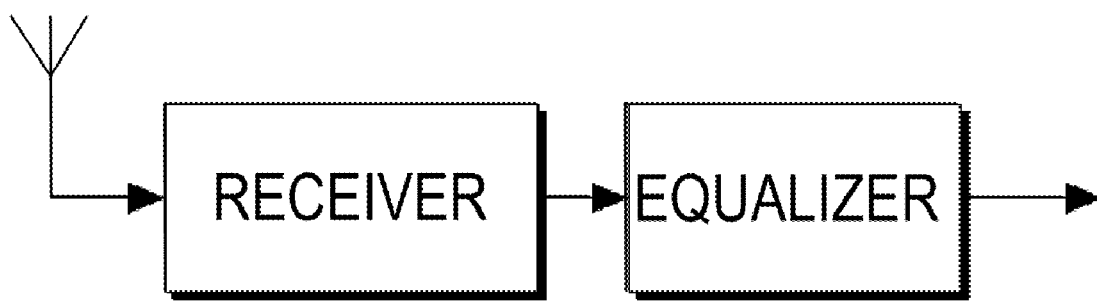
FIG. 31 shows a block diagram of a portion of a digital broadcasting receiver that performs equalization using SRS.

FIG. 31 shows a block diagram of a portion of a digital broadcasting receiver including a receiver to receive a transport stream including SRS data from a digital broadcasting transmitter such as the one shown in FIG. 5, and an equalizer to equalize the received stream using the SRS data in the transport stream. In the digital broadcasting transmitter in FIG. 5, the SRS data is inserted into the transport stream by the SRS stuffer, a block diagram of which is shown in FIG. 13.

Conclusion

Although several embodiments of the invention have been shown and described, it would be appreciated by those skilled in the art that changes may be made in these embodiments without departing from the principles and spirit of the invention, the scope of which is defined in the claims and their equivalents.

What is claimed is:

1. A digital broadcasting transmitter comprising:
   a randomizer;
   a supplementary reference sequence (SRS) pattern memory to store known data;
   a multiplexer to receive an output of the randomizer and the known data stored in the SRS pattern memory, and output a selected one of the output of the randomizer and the known data according to a control signal; and
   a trellis encoder which encodes the selected one of the output of the randomizer and the known data,
   wherein the known data comprises resetting bytes which are used to reset the trellis encoder.

2. A digital broadcasting transmitter comprising:
   a randomizer;
   a supplementary reference sequence (SRS) pattern memory to store known data; and
   a multiplexer to receive an output of the randomizer and the known data stored in the SRS pattern memory, and output a selected one of the output of the randomizer and the known data according to a control signal,
   wherein the SRS pattern memory is activated according to the control signal at a time point of insertion of the known data to output the known data stored in the SRS pattern memory to the multiplexer, and
   wherein the multiplexer outputs the output of the randomizer if the control signal is not received, and outputs the known data stored in the SRS pattern memory if the control signal is received, so that the known data is inserted into the stream at a predetermined time point.

3. A digital broadcasting receiver comprising:
   a receiver to receive a stream comprising randomized data multiplexed with known data from a digital broadcasting transmitter; and
   an equalizer to equalize the stream using the known data,
   wherein the known data was obtained from a supplementary reference sequence (SRS) pattern memory,
   wherein the digital broadcasting transmitter comprises a multiplexer to receive an output of the randomizer and the known data stored in the SRS pattern memory, and output a selected one of the output of a randomizer and the known data according to a control signal, and wherein the known data comprises resetting bytes which are used to reset a trellis encoder which encodes the selected one of the output of the randomizer and the known data of the digital broadcasting transmitter.

4. The digital broadcasting receiver of claim 3, wherein the SRS pattern memory was activated at a time point of insertion of the known data and output the known data to be multiplexed with the randomized data, so that the known data was inserted into the stream at a predetermined time point.

5. The digital broadcasting receiver of claim 3, wherein the stream received at the receiver further comprises syncs which are used for synchronization and equalization of the stream, and wherein, for the equalization of the stream, the equalizer uses the known data in addition to the sync signals.

6. The digital broadcasting receiver of claim 5, wherein the known data is inserted in a selected packet of a plurality of packets constituting the stream received at the receiver, each packet comprising one of the syncs at a header of the packet, and wherein the known data is inserted after the header in the selected packet.

7. The digital broadcasting receiver of claim 3, wherein the resetting bytes are included in a starting position of the known data.

8. A digital broadcasting receiver comprising:

a receiver to receive a stream comprising randomized data multiplexed with known data from a digital broadcasting transmitter; and an equalizer to equalize the stream using the known data;

wherein the known data was obtained from a supplementary reference sequence (SRS) pattern memory, wherein the digital broadcasting transmitter comprises a multiplexer to receive an output of the randomizer and the known data stored in the SRS pattern memory, and output a selected one of the output of a randomizer and the known data according to a control signal, wherein the SRS pattern memory is configured to activate according to the control signal at a time point of insertion of the known data to output the known data stored in the SRS pattern memory to the multiplexer, and wherein the multiplexer is configured to output the output of the randomizer if the control signal is not received, and output the known data stored in the SRS pattern memory if the control signal is received, so that the known data is inserted into the stream at a predetermined time point.

* * * * *